United States Patent [19]
Sameshima

[11] Patent Number: 5,424,238
[45] Date of Patent: Jun. 13, 1995

[54] METHOD FOR PRODUCING A SEMICONDUCTOR DEVICE HAVING A FERROELECTRIC STORAGE CELL

[75] Inventor: Katsumi Sameshima, Kyoto, Japan

[73] Assignee: Rohm Co., Ltd., Kyoto, Japan

[21] Appl. No.: 274,029

[22] Filed: Jul. 12, 1994

Related U.S. Application Data

[62] Division of Ser. No. 966,495, Oct. 26, 1992, Pat. No. 5,384,729.

Foreign Application Priority Data

Oct. 28, 1991 [JP] Japan ................... 3-281624
Oct. 28, 1991 [JP] Japan ................... 3-281625
Oct. 28, 1991 [JP] Japan ................... 3-281626
Oct. 29, 1991 [JP] Japan ................... 3-282887
Oct. 29, 1991 [JP] Japan ................... 3-282888

[51] Int. Cl.$^6$ ................... H01L 21/70; H01L 27/00
[52] U.S. Cl. ................... 437/52; 437/60; 437/919
[58] Field of Search ........... 437/47, 52, 60, 919, 437/29; 257/304–308, 311, 295–296; 365/145

[56] References Cited

U.S. PATENT DOCUMENTS 5,046,043  9/1991  Miller et al. ................... 365/145
5,198,994  3/1993  Natori ................... 365/145

Primary Examiner—Olik Chaudhuri
Assistant Examiner—H. Jey Tsai
Attorney, Agent, or Firm—Nikaido, Marmelstein, Murray & Oram

[57] ABSTRACT

A semiconductor storage device and a method for producing the same wherein a source region 2 and a drain region 3 are formed in a semiconductor substrate films 14 and 15 of low dielectric constant are formed respectively on the source region 2 and the drain region 3. A ferroelectric film 7 is formed on a channel region 6 surrounded by the source region 2 and the drain region 3. The ferroelectric film 7 is patterned on the films 14 and 15. According to the present invention, semiconductor material is not damaged during the formation and a dielectric polarization efficiency is increased.

4 Claims, 21 Drawing Sheets

1

METHOD FOR PRODUCING A SEMICONDUCTOR DEVICE HAVING A FERROELECTRIC STORAGE CELL

This is a divisional, of application Serial No. 07/966,495, filed Oct. 26, 1992, U.S. Pat. No. 5,384,709.

FIELD OF THE INVENTION

The present invention relates to a semiconductor storage device and a method for producing the same. More particularly, the present invention relates to a semiconductor storage device which enables non-destructive reading out and a method for producing the same. In a device of the present invention, reversal (or inversion) of dielectric polarization, hysteresis of ferroelectrics, is taken advantage of and patterning of the ferroelectrics is improved.

BACKGROUND OF THE INVENTION

A conventional semiconductor storage device employing a ferroelectric capacitor is shown in FIG. 31. In FIG. 31, numerals 1 to 3 respectively represent a semiconductor substrate, a source region and a drain region. Numerals 4 to 6 respectively represent a field insulator film for isolating elements, a gate insulating film and a channel region. Numerals 7 to 9 respectively represent a ferroelectric film, a gate electrode and an insulating film for insulating layers. Numerals 10 to 12 represent wiring of aluminium respectively for a source, a gate and a drain electrodes. Numeral 13 represents a passivation film.

When a voltage is applied between the gate electrode 8 and the semiconductor substrate 1, the ferroelectric film 7 is polarized. Once the film 7 is polarized, even if the applied voltage is made to 0V residual dielectric polarization remains there because of the hysteresis characteristics of ferroelectrics. When a voltage is applied between the source and the drain, the residual dielectric polarization induces electrons or positive holes at the channel region 6 at a surface of the substrate 1. Depending on the electrons or the positive holes, ON condition or OFF condition is switched between the source and the drain, whereby non-destructive reading out of stored information can be carried out.

This conventional semiconductor storage device is produced as follows. The field insulator film 4 is formed on the substrate 1. The gate insulating film 5, the ferroelectric film 7 and the gate electrode 8 are formed in this order. Patterning is carried out so that the film 7 and the electrode 8 remain on the channel region 6. Impurity ion is implanted with the film 7 and the electrode 8 being used as a mask to form the source region 2 and the drain region 3. Finally the insulating film 9, the electrodes and the like are formed.

As ferroeletrics in the semiconductor storage device, PZT (Pb $(Zr_{1-x}Ti_x)$ $O_3$), $PbTiO_3$ or the like having perovskite structure is utilized because of its high spontaneous dielectric polarization. However, these materials are not suitable for processing with etching or the like.

For fine processing of the materials, dry etching such as ion milling must be used. However, the ion milling is an ion beam etching with argon ion or the like, and for this reason high "selective ratio" can not be realized. The "selective ratio" means a ratio between etching rates of the ferroelectric film and the surroundings (the insulating film, the semiconductor and the like). Thus, the ion milling is apt to cause a damage to the surroundings. Particularly, when the gate insulating film 5 is thin and the ferroelectric film 7 on the film 5 is processed with the dry etching, too much etching breaks the film 5 and gives a damage to the substrate 1 to degrade transistor characteristic, on the other hand, insufficient etching causes the film 7 to remain.

Wet etching does not give a damage to the substrate 1 very much, however, it does not enable sufficient fine processing. Thus, wet etching is not suitable for processing a recent very large-scale integrated semiconductor device, because the device requires fine processing with accuracy of submicron order.

SUMMARY OF THE INVENTION

In view of the above-mentioned problems, an object of the present invention is to enable processing of ferroelectrics which is hard to be processed without influencing characteristics of the semiconductor device.

According to the first aspect of the present invention, there is provided a semiconductor storage device of which cell comprises a semiconductor substrate, a source drain region, a drain region, a channel region, a ferroelectric film and an electrode, the source region and the drain region being formed in the semiconductor substrate, a region of the substrate between the source region and the drain region serving as the channel region, and the ferroelectric film being formed on the channel region wherein a film of low dielectric constant is formed on the source region and the drain region, the film of low dielectric constant and the ferroelectric film are flush with each other, and an edge of the electrode formed on the ferroelectric film is positioned on the film of low dielectric constant.

In order to prevent the semiconductor material of the storage device from being damaged during etching treatment, there is provided a method :for producing a semiconductor storage device comprising:

(a) a step for forming a protecting film by patterning on a portion of a semiconductor substrate where a channel region is to be formed;

(b) a step for forming a source region at one side of the protecting film and a drain region at the other side of the protecting film by diffusing impurity;

(c) a step for forming a film of low dielectric constant having a different characteristic from that of the protecting film on the resulting substrate;

(d) a step for etching back the film of low dielectric constant so that the protecting film is exposed and the whole surface thereof is flushed;

(e) a step for removing the exposed protecting film to expose the semiconductor substrate surface;

(f) a step for forming a ferroelectric film on the exposed substrate surface directly or with a gate insulating film existing therebetween, and flushing the resultant surface;

(g) a step for etching back the ferroelectric film so that the film of low dielectric constant is exposed and the ferroelectric film and the exposed film are flush with each other;

(h) a step for forming an electrode on the ferroelectric film; and (i) a step for forming a source electrode, a drain electrode and a gate electrode.

According to the second aspect of the present invention, there is provided a semiconductor storage device of which cell comprising a semiconductor substrate, a source region, a drain region, a channel region, a ferroelectric film and a gate electrode, the source region and the drain region being formed in the semiconductor substrate, a region of the substrate between the source region and the drain region serving as the channel region, and the gate electrode being formed on the channel region wherein a film of low dielectric constant is formed on the source region and the drain region, and an edge of the ferroelectric film is positioned on the film of low dielectric constant.

In this structure, the gate insulating film, the gate electrode, the ferroelectric film, and the upper electrode for a capacitor are formed in this order on the channel region (MFMOS structure).

In order to prevent the semiconductor material of the storage device from being damaged during etching treatment, there is provided a method for producing a semiconductor storage device comprising:
(a) a step for forming a protecting film by patterning on a portion of a semiconductor substrate where a channel region is to be formed;
(b) a step for forming a source region at one side of the protecting film and a drain region at the other side of the protecting film by diffusing impurity;
(c) a step for forming a film of low dielectric constant having a different characteristic from that of the protecting film on the resulting substrate;
(d) a step for etching back the film of low dielectric constant so that the protecting film is exposed and the whole surface thereof is flushed;
(e) a step for removing the exposed protecting film to expose the semiconductor substrate surface;
(f) a step for forming a ferroelectric film on the exposed substrate surface directly or with a gate insulating film existing therebetween;
(g) a step for patterning the ferroelectric film on the film of low dielectric constant;
(h) a step for forming an electrode on the ferroelectric film; and
(i) a step for forming a source electrode, a drain electrode and a gate electrode.

If the surface of the ferroelectric film is not flat, the crystal orientation is not unified over the whole surface and polarized direction under an applied voltage is not unified, so that dielectric polarization efficiency is reduced. In view of this problem, in the third aspect of the present invention, the polarized direction is unified by arranging a gate electrode between the MOSFET and the ferroelectric film and by patterning the ferroelectric film with an improved technique.

That is, according to the third aspect of the present invention, there is provided a semiconductor storage device of which cell comprising a semiconductor substrate, a source region, a drain region, a channel region, a ferroelectric film and a gate electrode, the source region and the drain region being formed in the semiconductor substrate, a region of the substrate between the source region and the drain region serving as the channel region, and the gate electrode being formed on the channel region wherein a film of low dielectric constant is formed on the source region and the drain region, the film of low dielectric constant and the gate electrode are flush with each other, the ferroelectric film is formed on the film gate electrode so as to position its edge on the film of low dielectric constant, and an upper film electrode is formed on the ferroelectric film.

There are many cases that many storage cells are arranged in one semiconductor device. Plurality, when constituting a memory array, a plurality of identical storage cells must be arranged in a matrix. In view of this circumstance, in the fourth aspect of the present invention, in producing a semiconductor storage device having many storage cells, processing of the ferroelectric film (which is hard to be finely processed) is omitted as much as possible, whereby a semiconductor storage device easily producible is realized.

That is, according to the fourth aspect of the present invention, there is provided a semiconductor storage device having a plurality of storage cells comprising a semiconductor substrate, a source region, a drain region, a channel region, a ferroelectric film and a gate electrode, the source region and the drain region being formed in the semiconductor substrate, a region of the substrate between the source region and the drain region serving as the channel region, and the gate electrode being formed on the channel region wherein at least two of the ferroelectric films of the cells are formed continuously.

In order to omit the processing of the ferroelectric film as much as possible during formation, there is provided a method for producing a semiconductor storage device comprising:
(a') a step for forming a field insulator film for isolating elements on a semiconductor substrate and forming a protecting film by patterning on a portion of the semiconductor substrate of at least two cells where a channel region is to be formed;
(b') a step for forming, in the at least two cells, a source region at one side of the protecting film and a drain region at the other side of the protecting film by diffusing impurity;
(c) a step for forming a film of low dielectric constant having a different characteristic from that of the protecting film on the resulting substrate;
(d) a step for etching back the film of low dielectric constant so that the protecting film is exposed and the whole surface thereof is flushed;
(e) a step for removing the exposed protecting film to expose the semiconductor substrate surface;
(f'') a step for forming an integrated ferroelectric film on the exposed substrate surfaces of the at least two cells directly or with a gate insulating film existing therebetween;
(h) a step for forming an electrode on the ferroelectric film; and
(i) a step for forming a source electrode, a drain electrode and gate electrode.

According to the fifth aspect of the present invention, in order to prevent crystal defect of surface of the semiconductor substrate on removing the protecting film from the channel region, the protecting film is formed with the same material (easy to process) as the film of low dielectric constant. Further, problem that the alignments of mask may not correspond is solved, so that accurate channel lengh is realized.

That is, according to the fifth aspect of the present invention, there is provided a method for producing a semiconductor device comprising:
(j) a step for forming a protecting film by patterning on a portion of a semiconductor substrate where a channel region is to be formed;

(k) a step for forming a source region at one side of the protecting film and a drain region at the other side of the protecting film by diffusing impurity;

(l) a step for removing the protecting film, forming a film of low dielectric constant on the resulting substrate, and forming an opening to the film of low dielectric constant at a portion corresponding to the channel region;

(m) a step for forming a ferroelectric film on a substrate surface exposed in the opening directly or with a film gate electrode existing therebetween;

(n) a step for etching back to leave the ferroelectric film only on the substrate intended for the channel region;

(o) a step for forming a gate electrode on the ferroelectric film;

(p) a step for partially removing the film of low dielectric constant existing at the vicinity of both edge of the ferroelectric film and forming impurity diffusion regions there; and (g) a step for forming a source electrode, a drain electrode and a gate electrode.

According to the first aspect of the present invention, a film of low dielectric constant is formed on a source region and a drain region, and thereafter a ferroelectric film is formed on a channel region so that the film of low dielectric constant and the ferroelectric film are flush with each other. For this reason, when the ferroelectric film is too much etched by ion milling (dry etching) which does not bring high selective ratio and shows high ability of processing, only the thick film of low dielectric constant is partially etched and the semiconductor material is not etched. Thus, feature of cell is not influenced.

According to the first aspect of the present invention, the ferroelectric film on the channel region and the film of low dielectric constant on the source and the drain regions around the channel region are flush with each other. Thereon an electrode is formed so as to position its edge on the film of low dielectric constant. Due to this, the ferroelectric film is effectively utilized from edge to edge on the channel region surrounded by the source and the drain regions because the film of low dielectric constant does not serve as a capacitor even if an electrode is arranged thereon. Further, the electrode and a semiconductor substrate are parallel, whereby polarized direction is uniform and high performance capacitor is effectively constituted.

According to the second aspect of the present invention, the edge of the ferroelectric film is positioned on the film of low dielectric constant formed on the source and the drain regions. Due to this, like in the first aspect of the present invention, even in the case of too much etching by dry etching, only the thick film of low dielectric constant is partially removed and the semiconductor material is not etched. Thus the cell characteristics is not influenced.

The ferroelectric film extends beyond the channel region onto the film of low dielectric constant on the source and the drain regions. However, only the ferroelectric film existing on a gate insulating film on the channel region serves as a capacitor, and the ferroelectric film existing on the film of low dielectric constant does not serve as a capacitor. The reason therefor is that the film of low dielectric constant is scarcely polarized, is thick, and consumes major portion of applied voltage, so that effect of existence of the ferroelectric film is not critical.

Thus, only the ferroelectric film surrounded by the film of low dielectric constant on the source and the drain regions serves as a capacitor. The film of low dielectric constant can be etched with high selective ratio against the semiconductor substrate, so that fine processing is possible. Thus, a semiconductor storage device, employing ferroelectrics, having an accurate capacitor can be formed.

According to the third aspect of the present invention, the gate electrode is formed on the channel region so as to be flush with the film of low dielectric constant formed on the source and the drain regions, whereby the ferroelectric film is flushed at each cell. Both the upper and the lower surfaces of the ferroelectric film are flat, and the crystal orientation on film formation is unified. Further, the upper electrode and the gate electrode contacting with the ferroelectric film are made parallel to each other, so that voltage is applied perpendicular to the ferroelectric film to uniformly form the polarization direction.

In the third aspect of the present invention, the ferroelectric film is continuously formed on the film of low dielectric constant which is flush with the film gate electrode (lower electrode), so that the ferroelectric film is integrated with that of other storage cell. Even if the ferroelectric film must be patterned the patterning is performed on the film of low dielectric constant, whereby a fine processing is not required. Thus, the cell formation can be carried out without causing any damage to the semiconductor region.

According to the fourth aspect of the present invention, the ferroelectric film is continuously formed so as to extend on the film of low dielectric constant formed on the field insulator film, the source region and the drain region. That is, the ferroelectric film is continuously formed over at least two capacitors of the cells. For this reason, fine etching of the ferroelectric film is not required so that damage of the semiconductor material and consequent bad influence on the cell characteristics are prevented.

The ferroelectric film extends beyond the channel region onto the channel region of other storage cells through on the film of low dielectric constant. However, only the ferroelectric film existing on the gate insulating film on the channel regions serves as a capacitor, and one existing on the film of low dielectric constant does not serve as a capacitor as stated above. That is, only the ferroelectric film surrounded by the film of low dielectric constant formed on the source and the drain regions serves as a capacitor. The film of low dielectric constant can be finely etched because high selective ratio against the semiconductor substrate can be realized. Due to this, a semiconductor storage device, employing a ferroelectric film, having many storage cells can be produced with high accuracy.

According to the fifth aspect of the present invention, as a protecting film for formation of the source and the drain regions, a film capable of easily etched like the film of low dielectric constant is employed, and on forming the ferroelectric film, alignment is again performed. For this reason, there is a possibility that the alignments do not correspond. However, the source and the drain regions are rearranged after formation of the ferroelectric film with the ferroelectric film being used as a mask, whereby the channel length can be accurately controlled. Thus, excellent cell characteristics can be maintained, and further etching of the protecting film does not give any damage to the semiconductor region. This also contributes to maintenance of excellent cell characteristics. Further, the patterning of the ferroelectric film can be carried out on the film of low dielectric constant, and ion milling or the like does not give the semiconductor region any damage. Thus, the cell characteristic is not badly influenced.

DETAILED DESCRIPTION

According to the present invention, patterning of a ferroelectric film to be formed on a channel region of a FET is carried out on a film of low dielectric constant previously formed on a source region and a drain region. Due to this, even if dry etching such as ion milling is performed, only the surface of the film of low dielectric constant is etched so that semiconductor materials are not influenced at all.

As the film of low dielectric constant, for example, silicon dioxide film, silicon nitride film or the like can be used. They are conveniently used in ordinary production of a semiconductor device, and values of thier relative dielectric constant are about 4 to 7. This film is formed in about 0.5 μm thickness.

As materials for the ferroelectric film formed on the channel region, for example, PbTiO$_3$PZT (Pb (Zr$_{1-x}$ Ti$_x$) O$_3$), PLZT ((Pb$_{1-x}$ La$_x$) (Zr$_{1-y}$ Ti$_y$)$_{1-x/4}$ O$_3$) or the like can be used. They have oxide perovskite structure of high spontaneous dielectric polarization and values of their relative dielectric constant are about 100 to 2000. This ferroelectric film is formed on the whole surface of the semiconductor substrate by sputtering, CVD method, sol-gel method or the like.

This ferroelectric film can be patterned with good accuracy by dry etching such as ion milling. when the ferroelectric film is extended far from the channel region, the patterning does not require good accuracy so that wet etching can be carried out.

EXAMPLE 1

Figure 1:
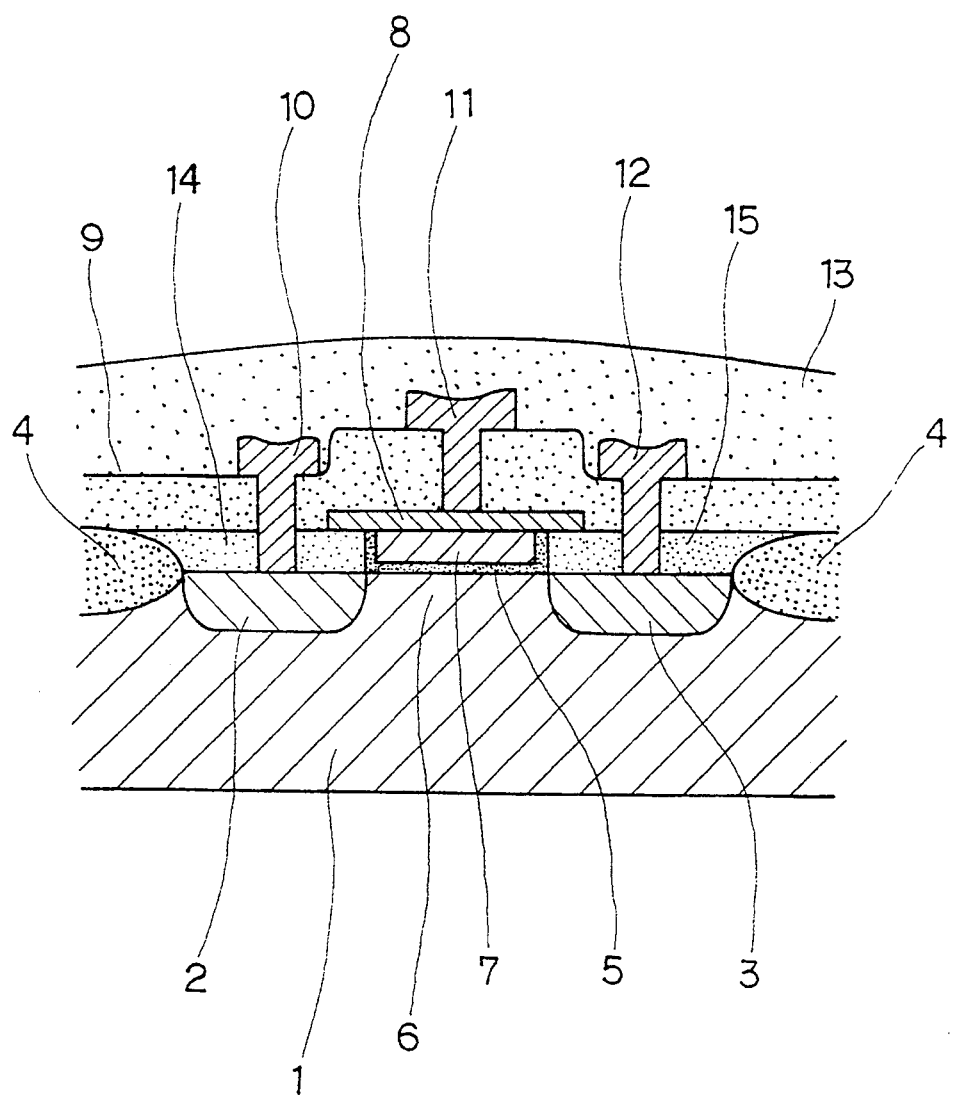
FIG. 1 is an explanatory sectional view showing a structure of a cell of a semiconductor storage device of the first embodiment of the present invention.
Figure 31:
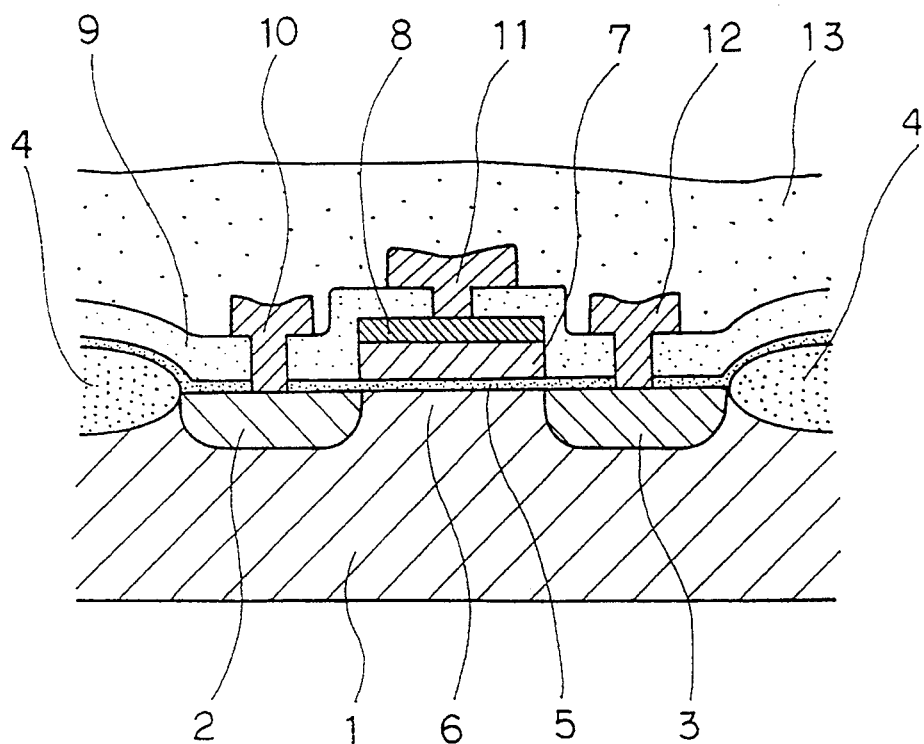
FIG. 31 is an explanatory sectional view showing a structure of a cell of a conventional semiconductor storage device.

Example 1 is explained below with reference to the drawings. FIG. 1 is a cross section showing a structure of a semiconductor storage cell of the first embodiment of the present invention. In FIG. 1, numerals 1 to 13 respectively represent the same elements or the same portions as those in FIG. 31.

In this example, films 14 and 15 of low dielectric constant are formed respectively on a source region 2 and a drain region 3. Thereafter a ferroelectric film 7 is formed so that the films 7, 14 and 15 are flush with each other. On the flush surface, an electrode 8 is formed so that the edge thereof is positioned on the films 14 and 15.

The film 7, 14 and 15 are formed from the above-mentioned materials respectively. The surface of the film 7 is flushed and etched back by dry etching such as ion milling till the films of low dielectric constant are exposed so that the films 7, 14 and 15 are flush with each other.

On this etching back, etching at the border with the film 7 is carried out on the films 14 and 15. For this reason, dry etching does not cause the substrate 1 to be damaged or the ferroelectric film 7 to remain. That is, the ferroelectric film to be etched later is positioned on the source region 2 and the drain region 3. Accordingly, if etching is carried out too much, only a part of thick oxide film or the like is removed and the semiconductor are not removed. Thus, the semiconductor or the like is not influenced.

The electrode 8 formed on the channel region 6 between the source region and the drain region extends beyond the channel region 6 onto the films 14 and 15 formed on the source region 2 and the drain region 3. In practical use as a storage cell, if a voltage is applied to the films 14 and 15 on writing, this region is scarcely polarized and does not serve as a capacitor. Thus, extension of the electrode 8 brings efficient use of the whole ferroelectric film as a capacitor.

Hereinafter, a method for producing the semiconductor storage device is explained. FIGS. 2 to 8 are respectively a cross section showing each producing step of the first embodiment of the semiconductor storage device.

Figure 2:
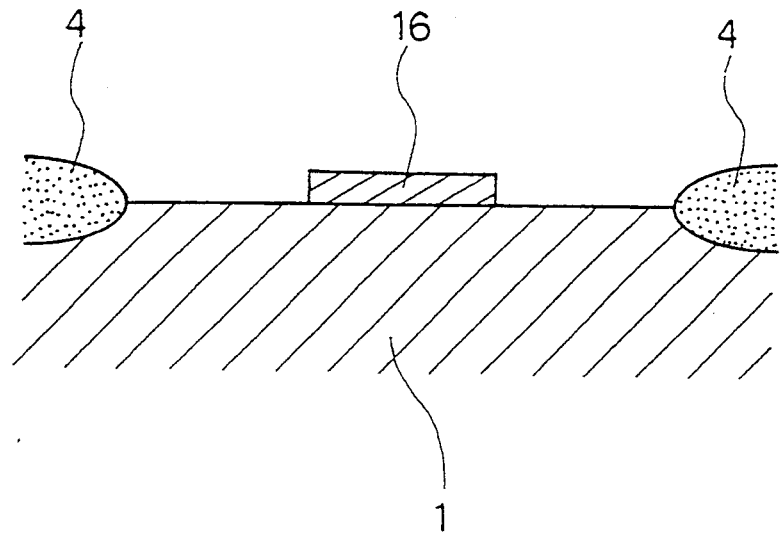
FIGS. 2 to 8 are respectively an explanatory sectional view showing each step for producing the semiconductor storage cell shown in FIG. 1.

Firstly, as shown in FIG. 2, silicon nitride film or the like is formed on the semiconductor substrate 1. The formed film is patterned to form a field insulator film 4 for isolating elements. A protecting film 16 is formed by patterning on the substrate 1 where a channel region 6 is to be formed. Specifically the p-type semiconductor substrate 1 on which the field insulator film 4 had been formed was subjected to a gas phase reaction with gaseous SiH$_2$cl$_2$ and gaseous NHa at about 750° C. (CVD method) to form a silicon nitride film in 0.5 μm thickness. This silicon nitride film was patterned by plasma etching to form the protecting film 16.

Figure 3:
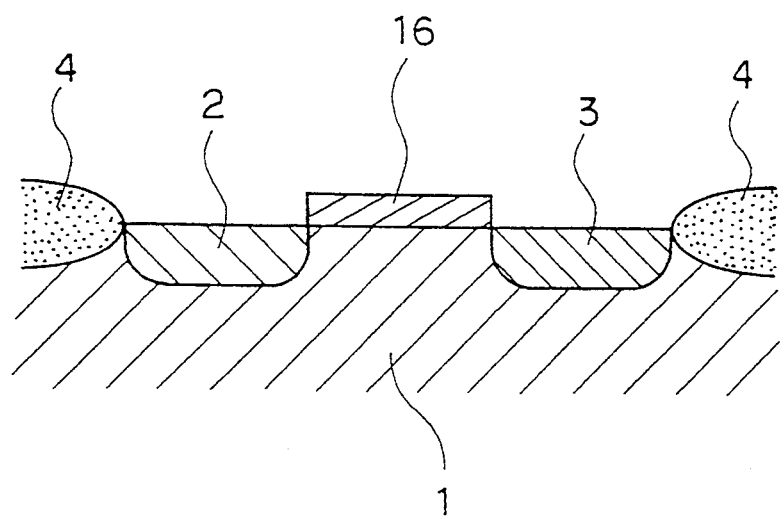

As shown in FIG. 3, impurity is diffused at both sides of the protecting film 16 to form a source region 2 and a drain region 3. Specifically, arsenic ion was implanted with a dose of $5 \times 10^{15}$ cm$^{-2}$ by implantation, thereafter, heat treatment at about 900° C. for about 30 minutes was performed to diffuse the implanted ion, whereby the n+-type source region 2 and the drain region 3 were formed.

Figure 4:
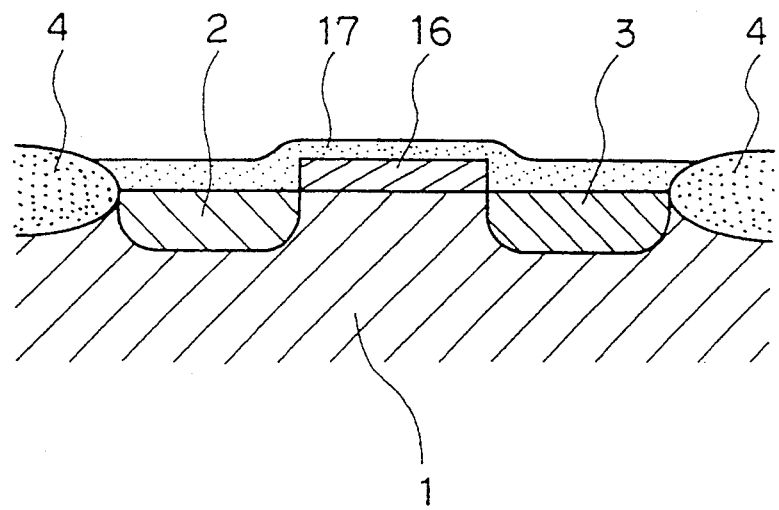

As shown in FIG. 4, a film 17 of low dielectric constant which has different characteristics from that of the protecting film 16 is formed on the whole surface of the substrate 1. Concretely, the substrate 1 was subjected to a gas phase reaction with gaseous SiH$_4$ and gaseous N$_2$O at about 800° C. (CVD method), whereby a silicon dioxide film was formed in about 0.6 μm thickness.

Figure 5:
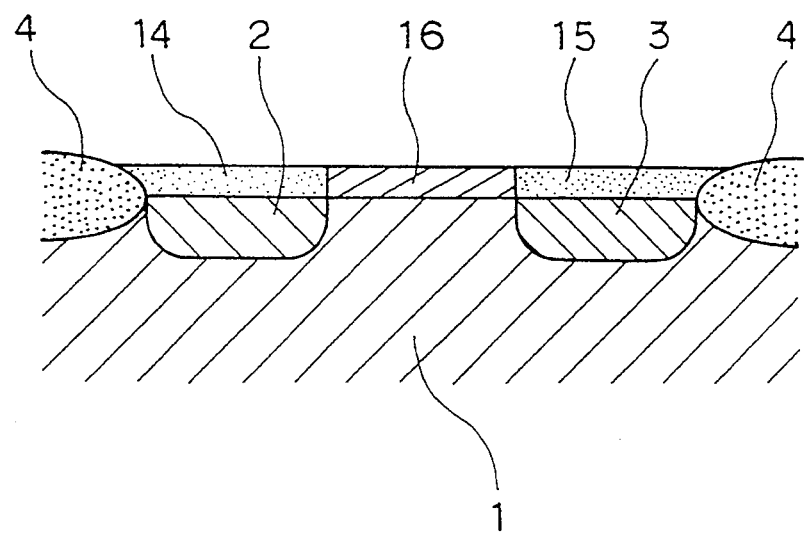

As shown in FIG. 5, the film 17 is etched back so that the protecting film 16 is exposed and the films 16 and 17 are flush with each other. Specifically, a resist was provided on the substrate 1 to flush the surface of the substrate 1. Thereafter, reactive ion etching (hereinafter referred to as RIE) was performed to remove the whole surface by a constant thickness and the protecting film 16 was exposed. Thus, the films 14 and 15 of low dielectric constant comprising silicon dioxide film were formed on the source region 2 and the drain region 3.

Figure 6:
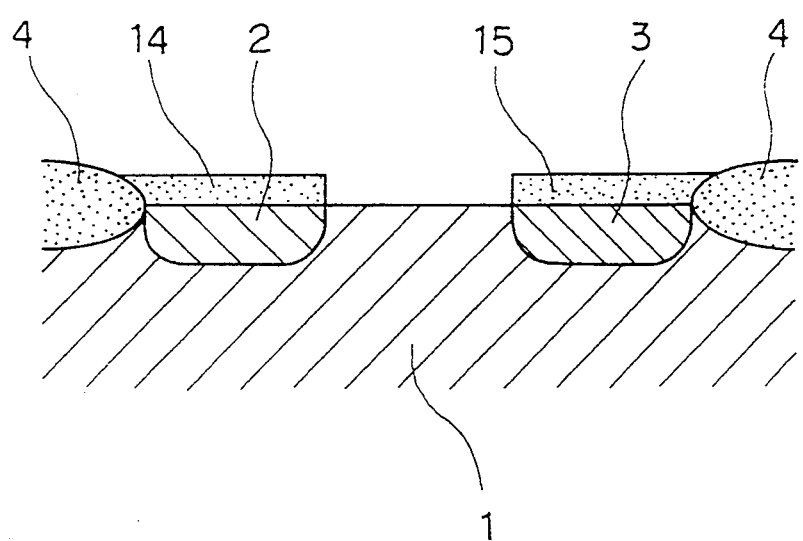

As shown in FIG. 6, the protecting film 16 is removed by etching to expose the substrate 1. This removing is carried out with a etchant with which only the protecting film 16 is removed but the films 14, 15 and 4 are not removed. Specifically, the removing was carried out with heated liquid H$_3$PO$_4$ so that only the protecting film 16, silicon nitride film, was removed and the films 4, 14 and 15, silicon oxide film, remained. Thus, the substrate 1 which had been covered with the film 16 was exposed.

Figure 7:
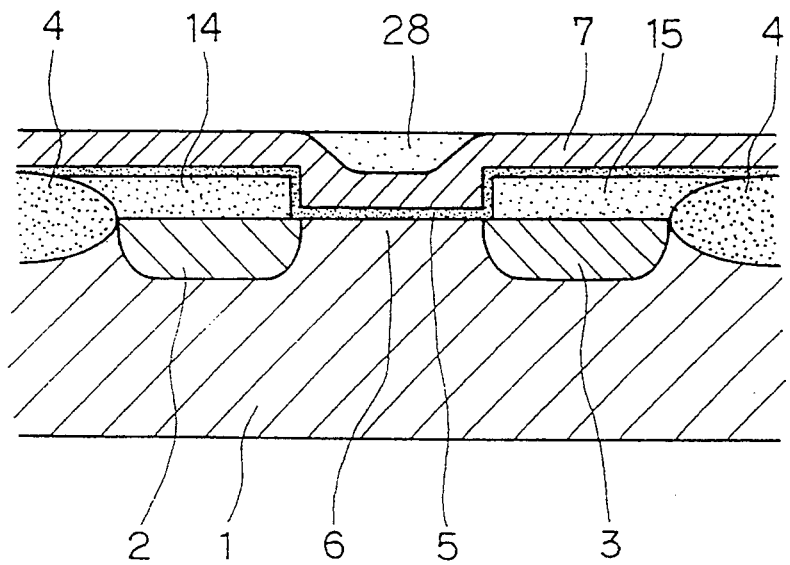

As shown in FIG. 7, a gate insulating film 5 and a ferroelectric film 7 are formed in turn and the surface of the film 7 is flushed. Specifically a silicon dioxide film of about 0.6 μm thickness was formed by CVD method with TEOS, and a PbTiO$_3$ film of 0.5 μm thickness was formed by sputtering. Thereafter, resist 28 was applied to the PbTiO$_3$ film to fill concaves so that the surface was flushed. When there is no reaction between the film 7 and the substrate 1, there is no need for the film 5.

Figure 8:
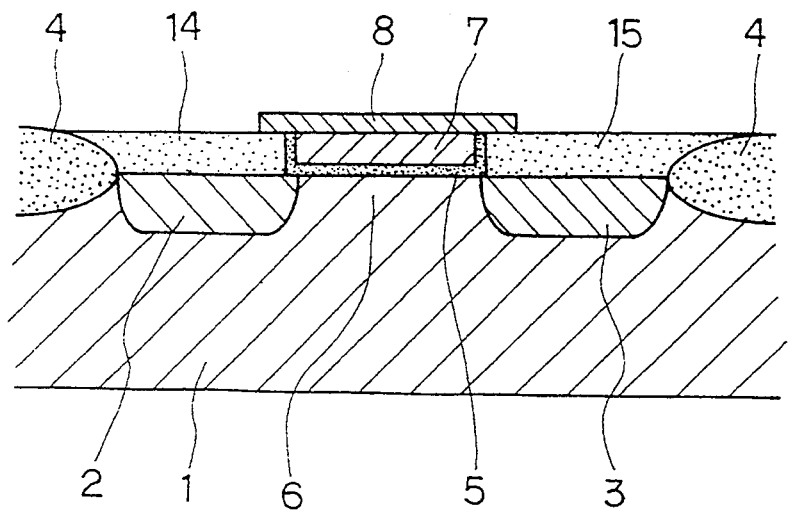

As shown in FIG. 8, the flushed surface is etched back to expose the films 14 and 15 so that the film 7 on the channel region 6 and the exposed films 14 and 15 become flush with each other. Thereafter a film electrode 8 is formed on the film 7. It is preferable that the film electrode 8 is formed so that its edge is positioned on the films 14 and 15. Specifically the etching back was carried out by ion milling (dry etching). In the ion milling, the whole surface is removed by a constant rate independent of the materials, that is, the resist 17 and the film 7 are removed by a constant rate. Since the surface was initially flushed, the films 7, 14 and 15 were flushed with each other by stopping the etching back when the films 14 and 15 were exposed.

The gate insulating film 5 was formed also on the films 14 and 15. This film 5 is not necessarily removed because dielectric constant of this film 5 is low like the films 14 and 15. Even if this film 5 is etched back the semiconductor is not damaged because the thick films 14 and 15 exist thereunder.

Platinum was deposited by sputtering and etching with RIE was carried out to form the gate electrode 8. The etching was performed so that the edge of the electrode 8 was positioned on the films 14 and 15.

An insulating film 9 for insulating elements was formed, wiring of aluminium for a source electrode 10, a gate electrode 11 and a drain electrode 12 were formed, and a passivation film 13 was formed with a conventional process. Thus, the semiconductor storage cell as shown in FIG. 1 was completed. Specifically a silicon dioxide film as the insulating film 9 was formed by CVD method, openings used for forming electrode were formed by RIE, aluminium film was deposited by sputtering to form each electrode, and a silicon dioxide film as the passivation film was formed by CVD method.

As explained above, the formation of the films 14 and 15 of low dielectric constant on the source and the drain regions is carried out with fine processing, and therebetween the ferroelectric film 7 is formed. Thereafter the ferroelectric film 7 is etched back so that it becomes flush with the films 14 and 15 of low dielectric constant. Due to this, there is no need for fine processing of the ferroelectrics on forming a capacitor. Further, since the ferroelectric to be removed is etched back on the thick films 14 and 15 of low dielectric constant, the semiconductor is not damaged. Thus, the above-mentioned problems on processing is solved, and the semiconductor storage cell of excellent characteristic and of high performance can be realized.

The ferroelectric film 7 and the films 14 and 15 on the source and the drain regions are flushed, and thereon the film electrode 8 is formed. Due to this, the electrode 8, the film 7 and the semiconductor substrate 1 are completely parallel to one another, whereby the polarized direction thereof is also completely parallel. Thus, high quality capacitor could be obtained. As a result, even under a low voltage, high dielectric polarization is achieved, whereby a semiconductor storage cell of high performance can be realized.

EXAMPLE 2

Figure 9:
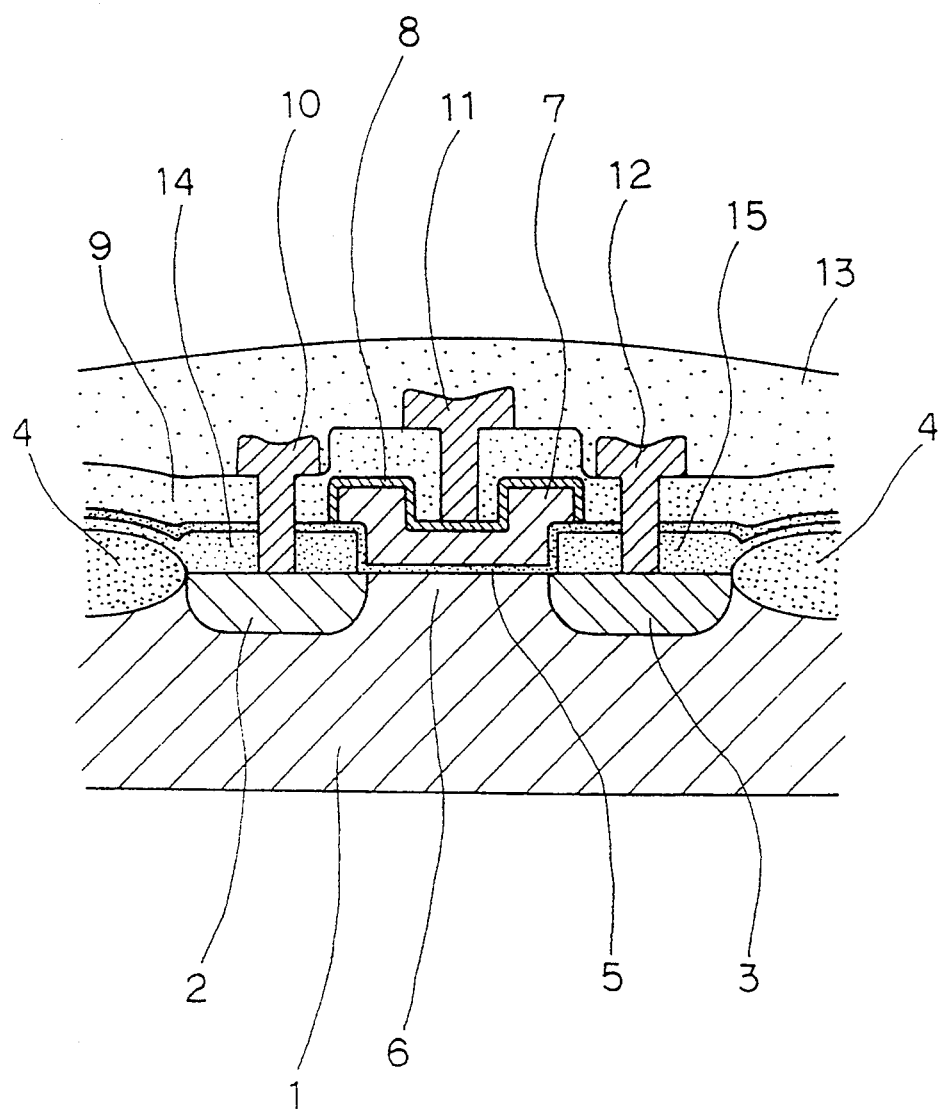
FIG. 9 is an explanatory sectional view showing a structure of a cell of a semiconductor storage device of the second embodiment of the present invention.

Hereinafter, a second example of the present invention is explained with reference to the drawings. FIG. 9 is a cross section showing a structure of a semiconductor storage cell of the second example of the present invention. In FIG. 9, numerals 1 to 15 respectively represent the same elements or the same portions as those in FIG. 1.

In this example, films 14 and 15 of low dielectric constant are formed respectively on a source region 2 and a drain region 3. Thereafter a ferroelectric film 7 is formed, where edge of patterning (namely, edge of the film 7) is positioned on the films 14 and 15. As the film 14 and 15 of low dielectric constant, a silicon dioxide film or a silicon nitride film can be used as stated above, and as the ferroelectric film 7, one having a perovskite structure can be used as stated above.

Since the etching of the ferroelectrics is carried out on the films 14 and 15, even if the etching is dry etching, the substrate 1 is not damaged or the film 7 does not remain. That is, since the removal of the ferroelectrics is carried out on the films 14 and 15, for example oxide films, formed on the source region 2 and the drain region 3, if the etching is carried out too much, only a part of the thick oxide film is removed and the semiconductor is not removed. Thus, transistors or the semiconductor is not influenced.

The ferroelectric film 7 formed on the channel region 6 surrounded by the source region and the drain region extends beyond the channel region 6 onto the films 14 and 15 formed on the source region 2 and the drain region 3. In practical use as a storage cell, if a voltage is applied to the films 14 and 15 on writing, this region is scarcely polarized because the applied voltage mainly acts on the films 14 and 15. Thus, the film 7 existing on the films 14 and 15 does not bring any bad influence.

Figure 10:
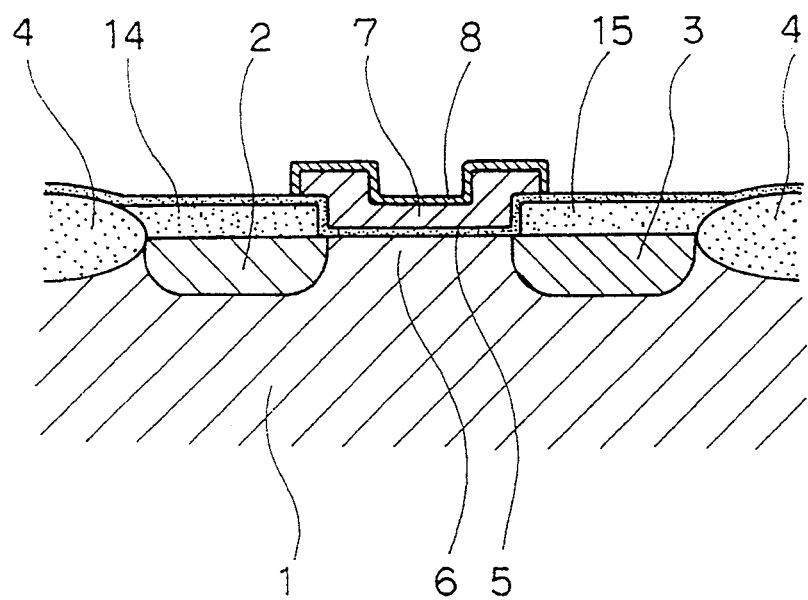
FIG. 10 is an explanatory sectional view showing one step for producing the semiconductor storage cell shown in FIG. 9.

Hereinafter, a method for producing the semiconductor storage cell is explained. Steps for forming a film of low dielectric constant on a source region and a drain region, and for removing a protecting film from a channel region are the same as in the first embodiment, and shown in FIGS. 2 to 6. FIG. 10 is a cross section showing a subsequent step inherent in this example.

After the step of FIG. 6, a gate insulating film 5 and a ferroelectric film 7 are formed in turn as shown in FIG. 10. Then, the film 7 is patterned. When there is no reaction between the film 7 and the substrate 1, the gate insulating film 5 is not required. The patterning is performed so that the edge of the film 7 is positioned on the films 14 and 15. Thereafter, a metal film is applied and is patterned to form a gate eletrode 8. Specifically, a silicon dioxide film of about 0.6 μm thickness was formed by CVD method with TEOS, and a PbTiO$_3$ film of 0.5 m thickness was formed by sputtering. Thereafter a mask for patterning was formed on the film 7 so that the edge of the film 7 remained on the films 14 and 15, and ion milling (dry etching) was performed. On etching with ion milling, the selective ratio can not be high, and the removed thickness can not be completely controlled. However even if the films 14 and 15 are damaged by the ion milling, the semiconductor is not damaged. For this reason, the characteristic of the semiconductor storage cell was not influenced at all. Thereafter platinum film was deposited by sputtering and was etched by RIE to form the gate electrode 8.

In this embodiment, the etching of the film 7 is carried out by dry etching. However the etching accuracy of the film 7 is not important on the films 14 and 15 because the film 7 existing on the films 14 and 15 does not serve as a capacitor and the capacitor performance depends on only the film 7 existing between the region 2 and 3. For this reason, wet etching with for example H$_2$O, HCL, HF, NH$_4$F or the like as an etchant can be also employed.

An insulating film 9 for insulating elements was formed, wiring of aluminium for a source electrode 10, a gate electrode 11 and a drain electrode 12 were formed, and a passivation film 13 was formed with a conventional process like in the first embodiment. Thus, the semiconductor storage cell as shown in FIG. 9 was completed.

Figure 11:
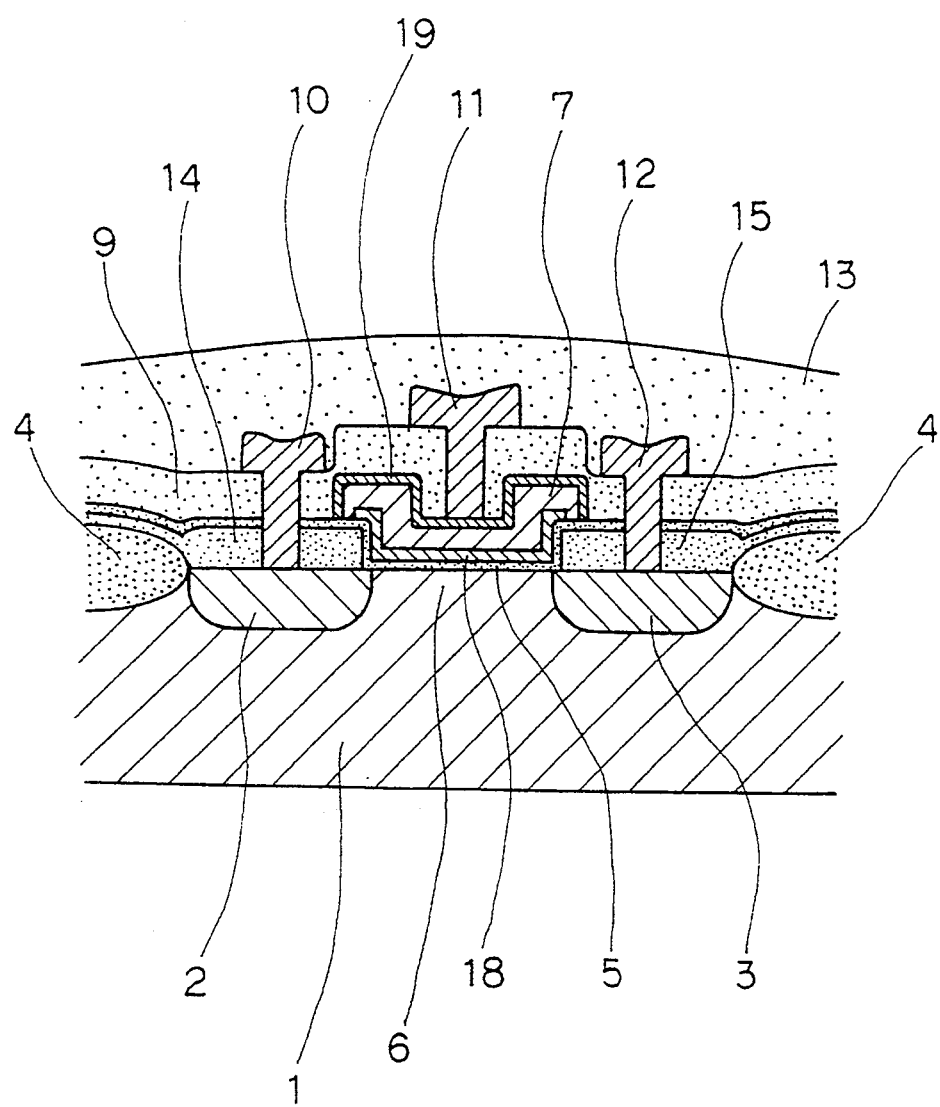
FIG. 11 is an explanatory sectional view showing another structure of a cell of a semiconductor storage device of the second embodiment of the present invention.

In FIG. 11, another structure of the semiconductor storage cell is shown. In this structure, a gate electrode is not positioned on the substrate via a gate insulating film and a ferroelectric film, but a gate electrode 18, a ferroelectric film 7 and an upper electrode 19 for a capacitor are formed on the gate insulating film 5 in this order. The other numerals represent the same elements or the same portions as those in FIG. 1, and their functions are also the same as those in FIG. 1.

In the structure shown in FIG. 9, the gate insulating film 5 of the MOSFET and the ferroelectric film 7 of the ferroelectric capacitor are sandwiched between the electrode 8 and the substrate 1. That is, the gate insulating film 5 exists there. Though the film 5 is thin, its dielectric constant is low. Thus, consequent high voltage is required on writing. On the other hand, since ferroelectric is not well adhered to a silicon substrate, it is preferable that additional buffer layer is arranged therebetween. However, if the buffer layer is employed, further high voltage is required on writing and efficiency is reduced. In view of these problems, in the structure shown in FIG. 11, the gate electrode 18 is arranged between the gate insulating film 5 and the ferroelectric film 7 and an electrode is provided therebetween. On writing, a voltage is applied between the electrode 18 and the upper electrode 19 on the film 7, and on reading out, polarized charge in the capacitor is transmitted to the gate electrode 11 so as to serve as a MOSFET (Japanese Patent Application No. 247714/1991).

Also in this structure, by making the edge of the ferroelectric film 7 be positioned on the films 14 and 15, a semiconductor storage cell employing ferroelectrics can be realized without reducing the characteristics thereof.

As explained above, etching of the ferroelectric film 7 is performed at a region where the performance does not influence the characteristics of the semiconductor and the capacitor. Due to this, a semiconductor storage cell of excellent characteristics can be realized even by dry etching such as ion milling which does not bring high selective ratio or by wet etching which does not enable fine processing.

As a result, the conventional problems on processing a semiconductor storage cell employing ferroelectrics is solved, and a semiconductor storage cell of excellent characteristics can be easily produced.

EXAMPLE 3

Figure 12:
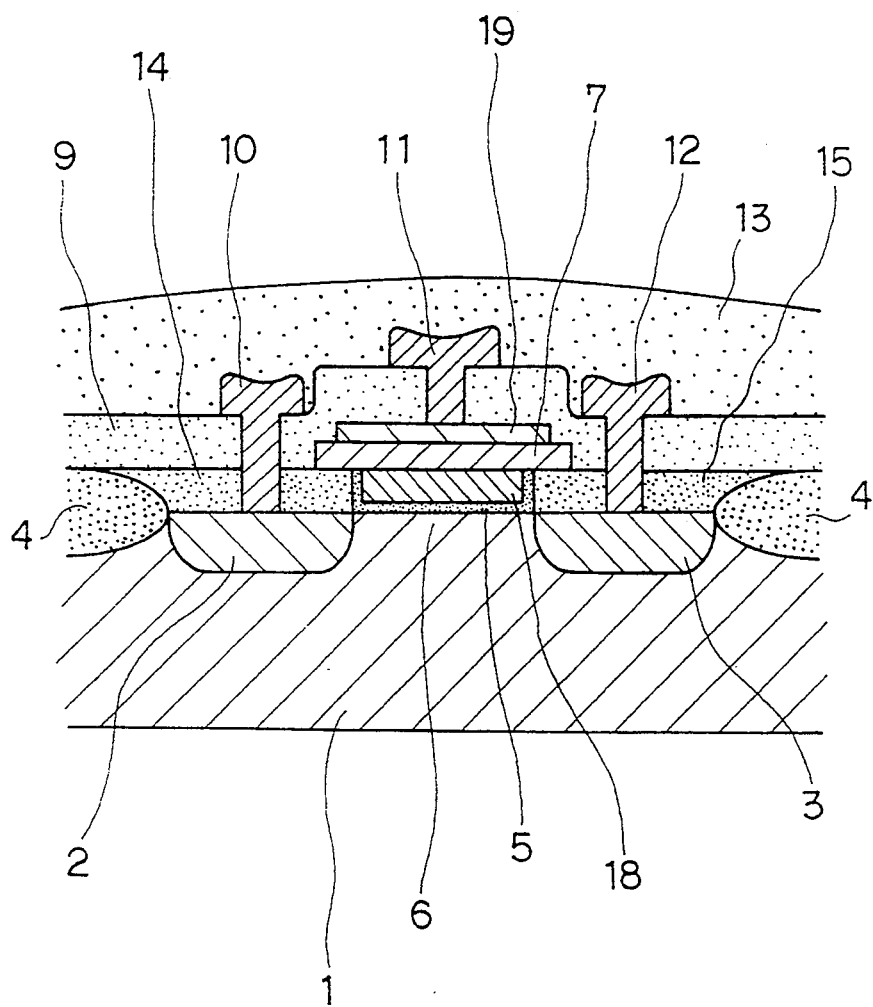
FIG. 12 is an explanatory sectional view showing a structure of a cell of a semiconductor storage device of the third embodiment of the present invention.

Hereinafter, a third example of the present invention is explained below with reference to the drawings. FIG. 12 is a cross section showing a semiconductor storage cell of the third embodiment of the present invention. In FIG. 12, numerals 1 to 15 respectively represent the same elements or the same portions as those in FIG. 1.

In this example, films 14 and 15 of low dielectric constant are respectively formed on a source region 2 and a drain region 3. Thereafter a gate insulating film 5 and a lower electrode intended for a gate electrode 18 are formed so as to be flush with the films 14 and 15. Thereon, a ferroelectric film 7 and an upper film electrode 19 are formed in turn. The edge of the film 7 is positioned on the films 14 and 15. As the films 14 and 15, a silicon dioxide film, silicon nitride film or the like can be used as stated above. As the ferroelectric film 7, one having a perovskite structure can be used as stated above.

Etching of the ferroelectric film 7 is performed on the films 14 and 15. Thanks to this, even if the etching is carried out by dry etching like in the first and second examples, the semiconductor substrate 1 is not damaged or the film 7 does not remain.

The ferroelectric film 7 formed on the channel region 6 surrounded by the source region and the drain region extends beyond the channel region 6 onto the films 14 and 15 formed on the source region 2 and the drain region 3. In practical use as a storage cell, if a voltage is applied to the films 14 and 15 on writing, dielectric polarization takes place only at a region where the lower film electrode (film gate electrode) 18 exists, while the film 7 on the films 14 and 15 is scarcely polarized and does not serve as a capacitor. Thus, the film 7 existing on the films 14 and 15 does not bring any bad influence.

Figure 15:
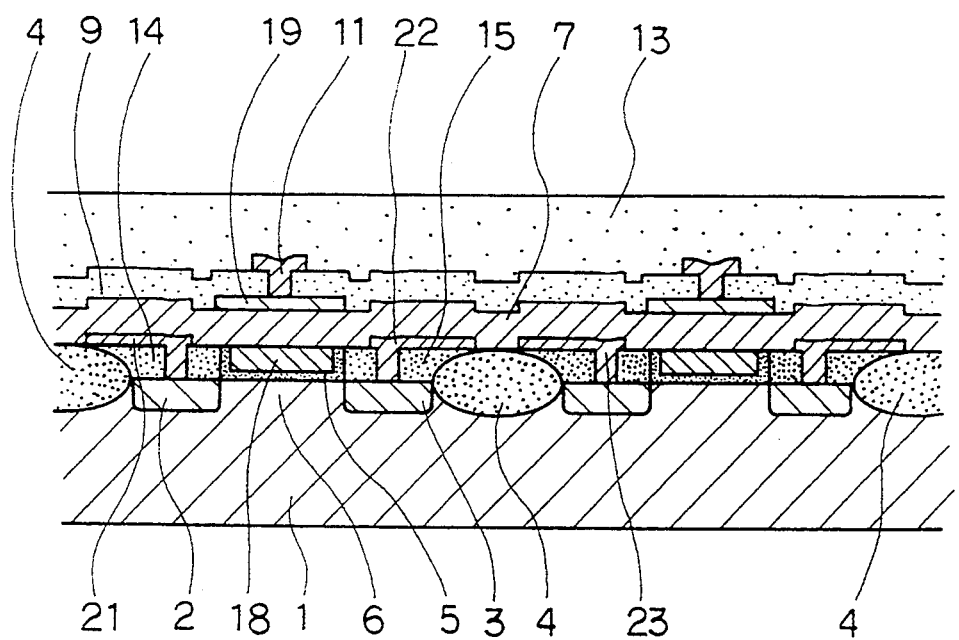
FIG. 15 is an explanatory sectional view showing another structure of a cell of a semiconductor storage device of the third embodiment of the present invention.

In view of this, when plural cells are employed and consequently plural ferroelectrics are required, the ferroelectrics can be integrated. In this case, since it is difficult to penetrate the film 7 with a source electrode or a drain electrode, it is preferable that previous to formation of the film 7, film electrodes 21, 22 and 23 are formed with WSi or the like and a source electrode and a drain electrode are formed on portions of the film electrodes 21, 22 and 23 on which the film 7 is not formed. In FIG. 15, the film electrodes 21, 22 and 23 extend perpendicularly to the drawings, and electrodes which is provided on the source and the drain do not appear in FIG. 15.

The film 7 is flat because it is formed on a plane. Therefore, crystal orientation on film formation is unified. Further the film electrodes at the both sides are also parallel. For these reasons, electrical field can be applied in parallel so that efficient polarization can be realized to improve the dielectric polarization characteristics thereof.

Figure 13:
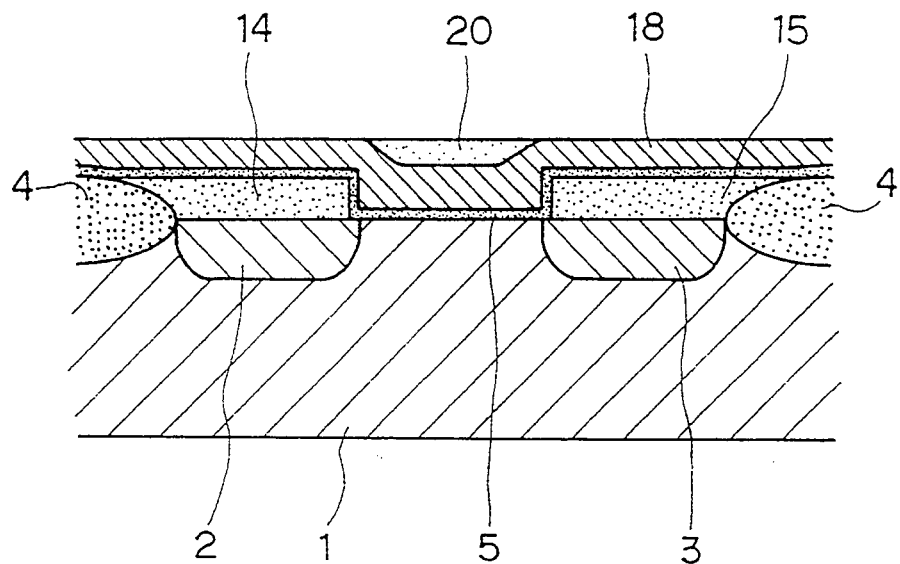
FIGS. 13 to 14 are respectively an explanatory sectional view showing one step for producing the semiconductor storage cell shown in FIG. 12.
Figure 14:
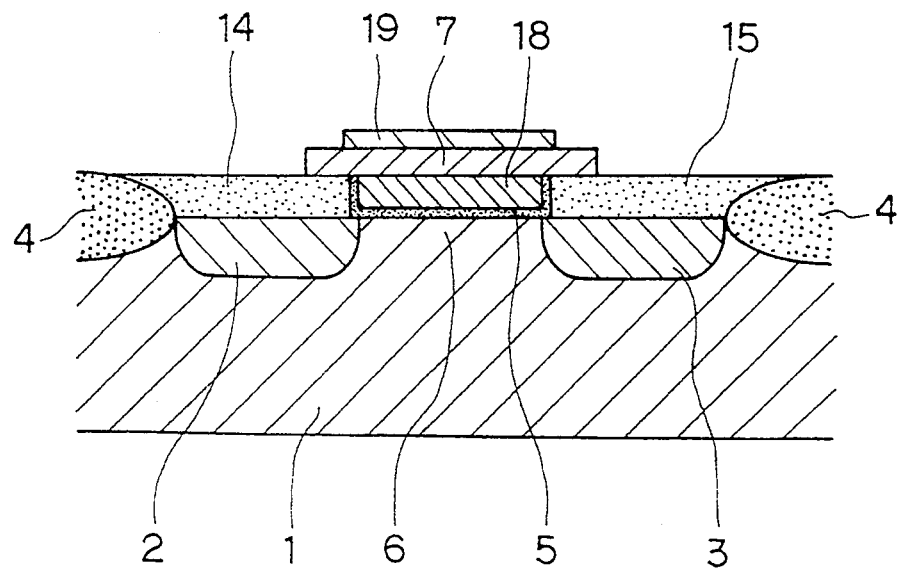

Hereinafter, a method for producing the semiconductor storage cell is explained. Steps for forming a film of low dielectric constant on a source region and a drain region, and for removing a protecting film from a channel region are the same as in the first example, and shown in FIGS. 2 to 6. FIGS. 13 and 14 are respectively a cross section showing subsequent steps inherent in this embodiment.

After the step of FIG. 6, a gate insulating film 5 and a lower film electrode 18 are formed in turn. Then, a resist 20 is applied and flushed shown in FIG. 13. Specifically, a silicon dioxide film of about 0.3 μm thickness was formed by CVD method with TEOS, and thereafter metal such as platinum was deposited in about 0.3 μm thickness by sputtering, and the resist 20 was applied thereon by spin coating so as to be flushed.

The whole surface of the substrate 1 is etched back till the lower electrode 18 and the films 14 and 15 of low dielectric constant are exposed. Thereafter the film 7 is formed and patterned to form the upper film electrode 19 as shown in FIG. 14. Specifically, the etching back is carried out by ion milling till the films 14 and 15 and lower film electrode 18 were exposed. After the etching back, the substrate surface was flushed, where on the channel region 6 the lower film electrode 18 was exposed, and therearound the films 14 and 15 were exposed. Then 0.3 μm of $PbTiO_3$ film was formed by sputtering. Thereafter a pattern was formed on the film 7 so that the edge of the film 7 remained on the films 14 and 15, and ion milling (dry etching) was performed to form the film 7. On etching with ion milling, the selective ratio can not be high, and the removed thickness can not be completely controlled. However even if the films 14 and 15 are damaged by the ion milling, the semiconductor is not damaged. For this reason, the characteristic of the semiconductor storage cell was not influenced at all. Thereafter platinum film was deposited by sputtering and was etched by RIE to form the upper film electrode.

In this example, the etching of the film 7 is carried out by dry etching. However, when the film 7 is etched on the films 14 and 15, the etching accuracy of the film 7 is not important. Thus, like in the second embodiment, wet etching with for example $H_2O$, HCL, HF, $NH_4F$ or the like as an etchant can be also employed.

An insulating film 9 for insulating elements was formed, wiring of aluminium for a source electrode 10, a gate electrode 11 and a drain electrode 12 were formed, and a passivation film 13 was formed with a conventional process like in the first example. Thus, the semiconductor storage cell as shown in FIG. 12 was completed.

As stated above, since the ferroelectric film is formed on the flushed surface of the lower film electrode and the films of low dielectric constant, good crystal layer of uniform orientation can be obtained. Further, the film electrode and the ferroelectric film are all in parallel. For these reasons, dielectric polarization in a uniform direction is realized and efficiency of dielectric polarization is increased.

In this embodiment, the ferroelectric film is continuously formed to be shared by two or more cells. Or even if etching is performed, the etching of the ferroelectric film 7 is performed at a region where the performance does not influence the characteristics of the semiconductor and the capacitor. Due to this, a semiconductor storage cell of excellent characteristics can be realized even by dry etching such as ion milling which does not bring high selective ratio or by wet etching which does not enable fine processing.

As a result, the conventional problems on processing a semiconductor employing ferroelectrics is solved, and a semiconductor storage cell of excellent characteristics can be easily produced.

EXAMPLE 4

Figure 16:
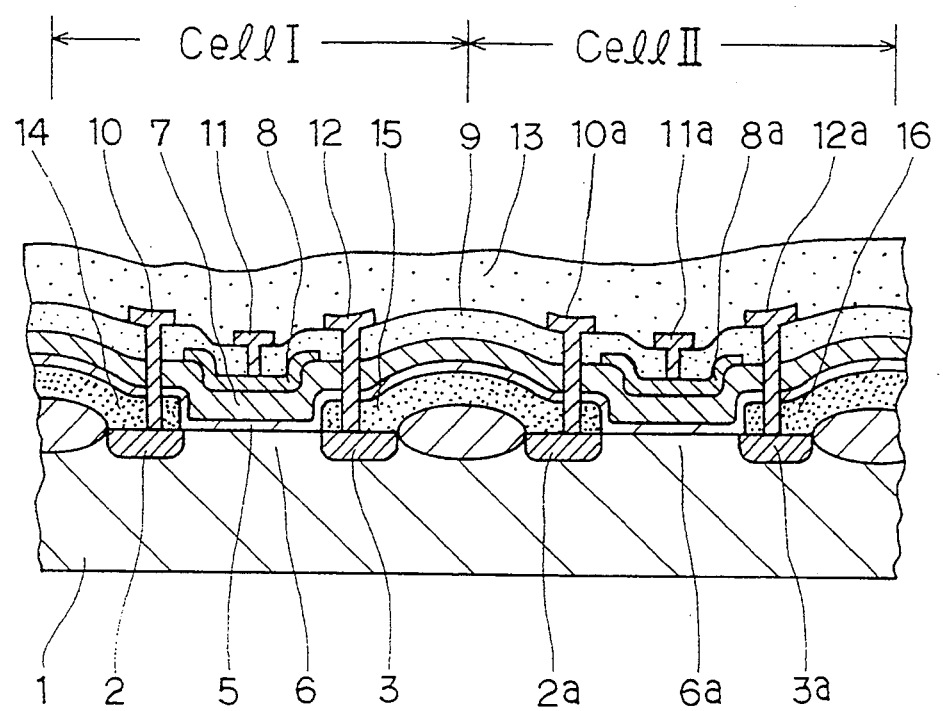
FIG. 16 is an explanatory sectional view showing a structure of a semiconductor storage device of the fourth embodiment of the present invention.

Hereinafter, a fourth example of the present invention is explained with reference to the drawings. FIG. 16 is a cross section showing a structure of a cell of the fourth embodiment of the present invention. In FIG. 16, numerals 1 to 15 respectively represent the same elements or the same portions as those in FIG. 1. A storage cell I is composed of the elements 1 to 15, and another storage cell II is composed of corresponding elements 1a to 15a. The elements shared by the cells I and II are represented by numerals in the cell I.

In this example, films 14, 15 and 16 of low dielectric constant are respectively formed on source regions 2 and 2a and drain regions 3 and 3a. Thereon a ferroelectric film 7 is continuously formed over each cell. Thus, on channel regions 6 and 6a the film 7 is formed with the thin gate insulating film being located therebetween, and on the other regions the film 7 is formed on the thick films 14, 15 and 16. As the films 14, 15 and 16, a silicon dioxide film or a silicon nitride film can be used as stated above. As the ferroelectric film, one having a perovskite structure can be used as stated above.

Unnecessary part of the ferroelectric film is removed by dry etching such as ion milling or by wet etching. In this embodiment the ferroelectric films of each storage cell are integrated, and unnecessary part of the film 7 not intended for storage cell and part of the film 7 existing between film electrodes with interposition of films for insulating between elements are removed because unnecessary capacity is produced there.

Since the etching of this ferroelectric film is performed on the films 14, 15 and 16, if the etching is dry etching, the substrate 1 is not damaged or the ferroelectric film does not remain like in the first example. The etching is performed at a region where the capacitor of the cell is not influenced, and etching accuracy is not important. For this reason, wet etching can be also employed.

The ferroelectric film 7 formed on the channel region 6 between the source and the drain regions extends beyond the channel region 6 onto the source regions 2, 2a, the drain regions 3, 3a and the films 14, 15, 16 formed on the field insulating film. Thus, the film 7 is continuously formed onto the channel region 6a of the cell II, however, the film electrode exists only in small area of the film 7 on the films 14, 15 and 16. So, in practical use as a storage cell, even in the region where the film electrode exists, applied voltage mainly acts on the thick films 14, 15 or 16. For this reason, on writing in practice, the region on the films 14, 15 and 16 are scarcely polarized and does not serve as a capacitor. The ferroelectric film 7 existing on the films 14, 15 and 16 does not badly influence the characteristics of the cell at all.

Hereinafter, a method for producing the semiconductor storage cell is explained. FIGS. 17 to 22 are respectively a cross section showing each step of the method.

Figure 17:
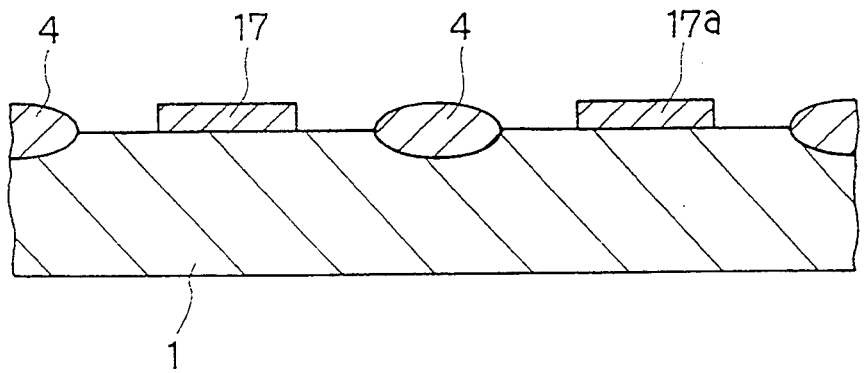
FIGS. 17 to 22 are respectively an explanatory sectional view showing each step for producing the semiconductor storage device shown in FIG. 16.

A silicon nitride film or the like is formed on a semiconductor substrate 1 and is patterned to form a field insulating film 4 for isolating elements. Thereafter, protecting films 17 and 17a are formed on a place where channel regions 6 and 6a are to be formed as shown in FIG. 17. Specifically, this was carried out in the same manner as in the first embodiment (refer to FIG. 2).

Figure 18:
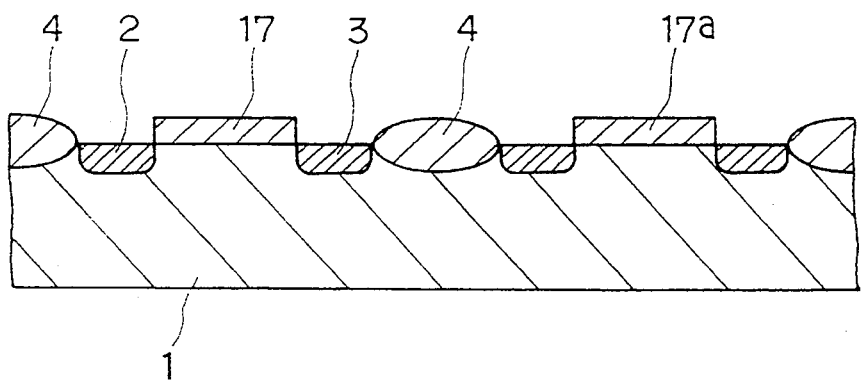

Impurity is diffused at both sides of the protecting films 17 and 17a to form source regions 2, 2a and drain regions 3, 3a as shown in FIG. 18. Concretely, this was carried out in the same manner as in the first example (refer to FIG. 3).

Figure 19:
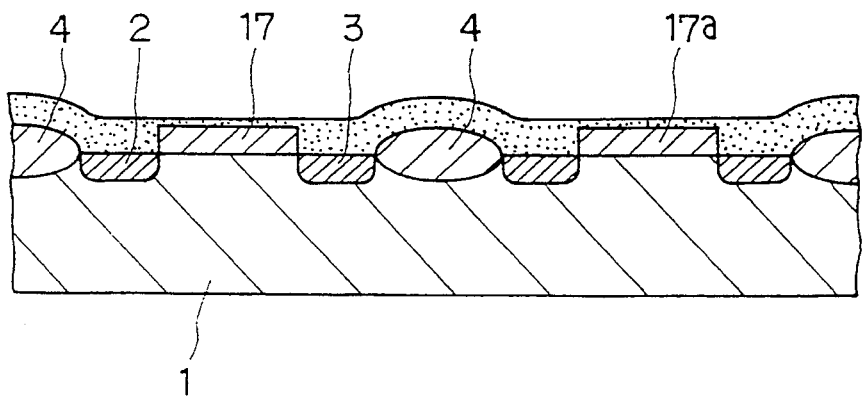

A film of low dielectric constant having a different characteristics from that of the films 17 and 17a is formed on the whole surface of the substrate 1 as shown in FIG. 19. Specifically, this was carried out in the same manner as in example 1 (refer to FIG. 4).

Figure 20:
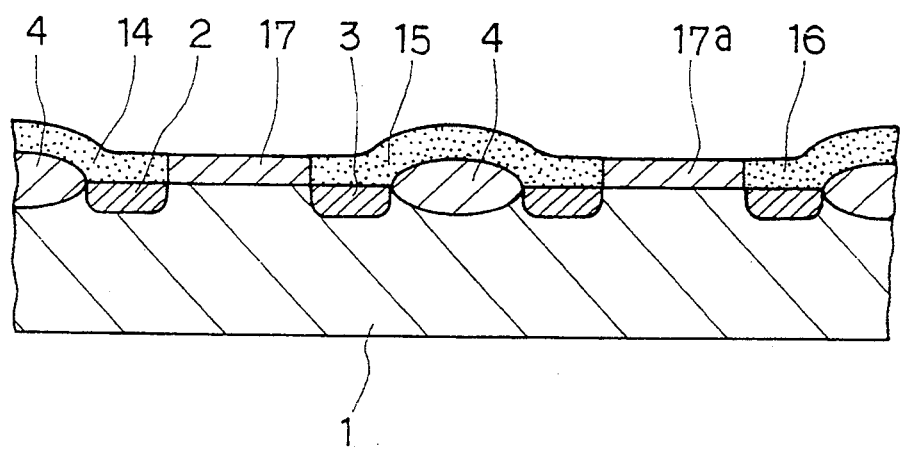

The formed film is etched back so as to be flushed and the protecting films 17 and 17a are exposed as shown in FIG. 20. Specifically, this was carried out in the same manner as in the first example (refer to FIG. 5).

Figure 21:
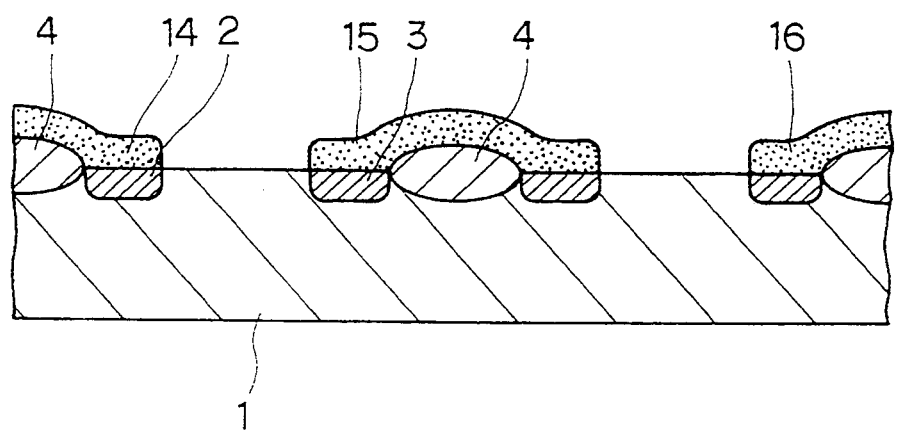

The protecting films 17 and 17a are removed by etching with an etchant which only etches the protecting films 17, 17 a but not the films 4, 14, 15, 16, whereby the substrate 1 is exposed as shown in FIG. 21. Specifically, this was carried out in the same manner as in the first example (refer to FIG. 6).

Figure 22:
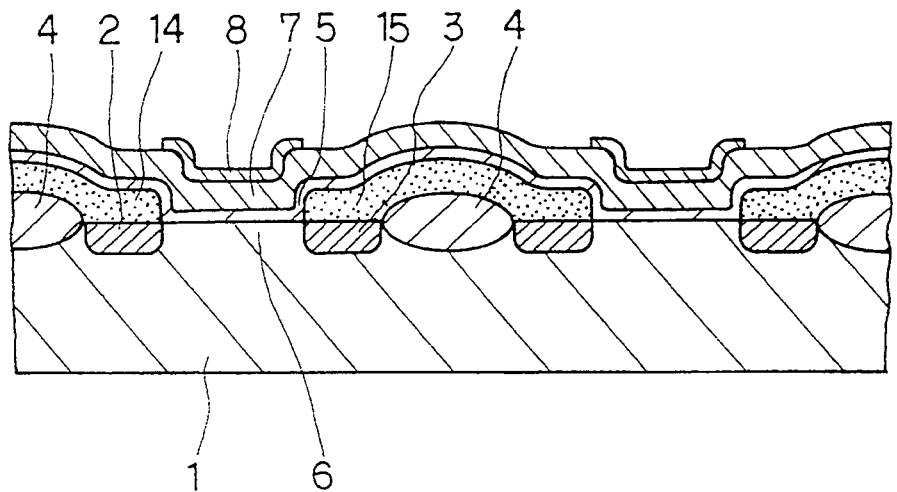

A gate insulating film 5 and a ferroelectric film 7 are formed in turn and unnecessary part of the film 7 not intended for storage cell is removed. When there is no reaction between the film 7 and the substrate 1, the gate insulating film 5 is not required. Since the film 7 is formed continuously so as to be shared by each storage cell, the etching can be carried out at a region where the cell characteristics is not influenced. Thereafter, a metal film is deposited and patterned to form gate electrodes 8, 8a of each cell as shown in FIG. 22. Concretely, a silicon dioxide film of about 0.6 μm thickness was formed by CVD method with TEOS, and a PbTiO₃ film of 0.5 μm thickness was formed by sputtering. The film 7 existing at element edges, and unnecessary film 7 not intended for cell and laminated with the film electrodes were removed by etching with an etchant of for example H₂O, HCl, HF, NH₄F or the like. Since this etching of the film 7 does not require a high accuracy unlike a capacitor formation, the characteristic is not badly influenced at all even with wet etching. Thereafter platinum was deposited by sputtering and was etched by RIE to form the film gate electrodes 8 and 8a of each cell.

In this example, the etching of the film 7 was performed with wet etching. However, because the film 7 is formed on the films 14, 15 and 16 of low dielectric constant, even if the etching is performed with dry etching which does not bring high selective ratio the semiconductor is not influencend, while only part of the films 14, 15 and 16 is etched a little.

An insulating film 9 for insulating elements is formed, wiring of aluminium for a source electrodes 10, 10a, a gate electrodes 11, 11a and a drain electrodes 12, 12a are formed, and a passivation film 13 is formed with a conventional process. Thus, the semiconductor storage cell as shown in FIG. 16 is completed. Specifically, a silicon dioxide film as the insulating film 9 was formed by CVD method, openings for electrode contact were formed by RIE and with a mixed acid solution for ferroelectric, aluminium film was deposited by sputtering to form each electrode, and a silicon dioxide film as the passivation film was formed by CVD method.

In this example, openings for contact are formed on the ferroelectric film 7. In order to omit this formation, it is possible that previous to formation of the film 7, openings are formed on the films of low dielectric constant, and film electrodes of tungsten silicide (WSi) or the like are formed there, so that the source and the drain electrodes are formed under the film 7.

Figure 23:
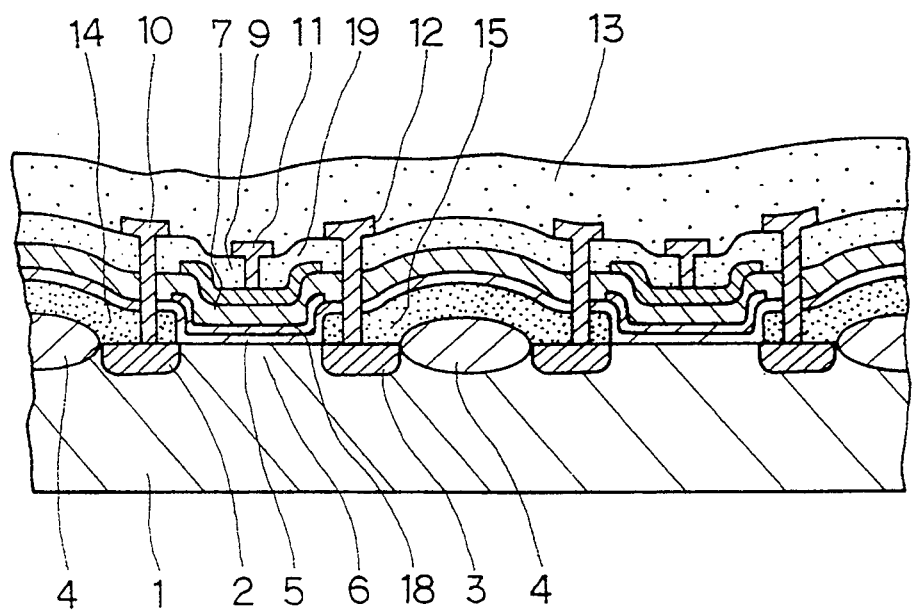
FIG. 23 is an explanatory sectional view showing another structure of a semiconductor storage device of the fourth embodiment of the present invention.

In FIG. 23, another structure of the semiconductor storage cell is shown. In this structure, a gate electrode is not positioned on the substrate via a gate insulating film and a ferroelectric film, but a gate electrode 18, a ferroelectric film 7 and an upper electrode 19 for a capacitor are formed on the gate insulating film 5 in this order. The other numerals represent the same elements or the same portions as those in FIG. 16, and their functions are also the same as those in FIG. 16.

In the structure shown in FIG. 16, the dielectric films of the MOSFET and the ferroelectric capacitor are sandwiched between the electrode 8 and the substrate 1. That is, the gate insulating film 5 exists there. Though the film 5 is thin, its dielectric constant is low. Thus, consequent high voltage is required on writing. On the other hand, since ferroelectric is not well adhered to a silicon substrate, it is preferable that additional buffer layer is arranged therebetween. However, if the buffer layer is employed further high voltage is required on writing and efficiency is reduced. Against these problems, the structure shown in FIG. 23 is improved as above-mentioned.

Also in this structure, if the films 14, 15, 16 of low dielectric constant is formed on the source regions 2, 2a and the drain regions 3, 3a, and the ferroelectric film 7 is continuously formed over two or more storage cells, a semiconductor storage cell employing ferroelectrics can be realized without reducing the characteristics thereof.

As explained above, in a semiconductor storage device having many storage cells, ferroelectric films intended for capacitors of each cell are integrated to one film so as to be shared by each cell, whereby etching of unnecessary part of the ferroelectric film can be performed at a place where the cell characteristics is not influenced. Due to this, a semiconductor storage cell of excellent characteristics can be realized even by dry etching such as ion milling which does not bring high selective ratio or by wet etching which does not enable fine processing.

As a result, the problems on processing a semiconductor storage device having many storage cells and employing ferroelectrics is solved, and a semiconductor storage device of excellent characteristics can be easily produced.

EXAMPLE 5

Hereinafter, a method for producing a semiconductor storage cell of a fifth embodiment of the present invention is explained. Though in the first to fourth examples the protecting film on the channel region 6 was a silicon nitride film, in this example the protecting film is composed of materials suitable for processing to prevent surface defect of semiconductor. FIGS. 24 to 30 are respectively a cross section showing each step of the method. In these FIGS., numerals 1 to 15 respectively represent the same elements or the same portions as those in FIG. 1.

Figure 24:
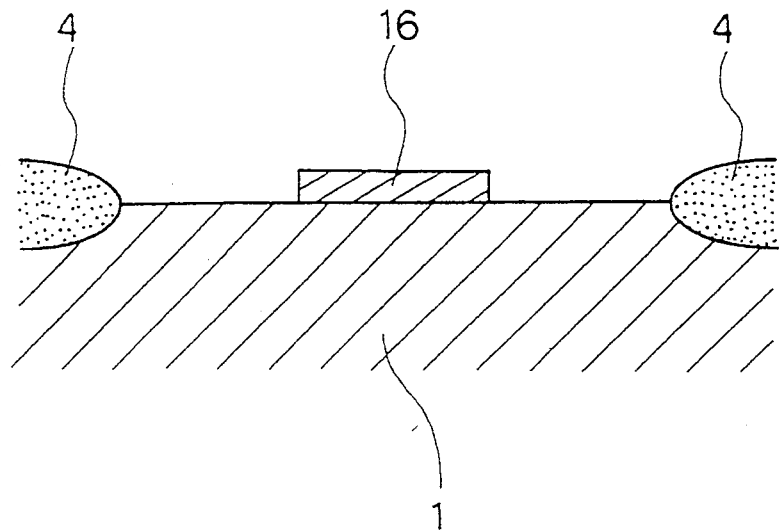
FIGS. 24 to 30 are respectively an explanatory sectional view showing each step for producing a semiconductor storage device of the fifth embodiment of the present invention.

A field insulator film 4 is formed on a semiconductor substrate 1 with a patterned silicon nitride film. Thereafter a protecting film 16 is patterned on a place where a channel region 6 is to be formed as shown in FIG. 24. It is preferable that the width of the protecting film 16 is so formed as to be slightly wider than the width of the channel region 6 in view of the following reason. Specifically, resist was applied to the p-type semiconductor substrate 1 on which the field insulator film 4 had been formed to form a resist film of about 1.6 μm thickness. Then the film was developed to form the protecting film 16.

Figure 25:
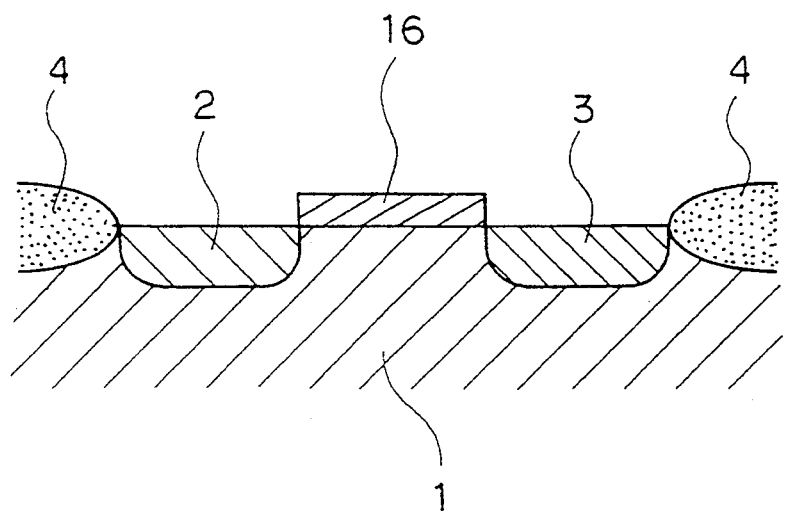

Impurity is diffused at both sides of the film 16 to form a source region 2 and a drain region 3 as shown in FIG. 25. Specifically, this was carried out in the same manner as in the first example (refer to FIG. 3).

Figure 26:
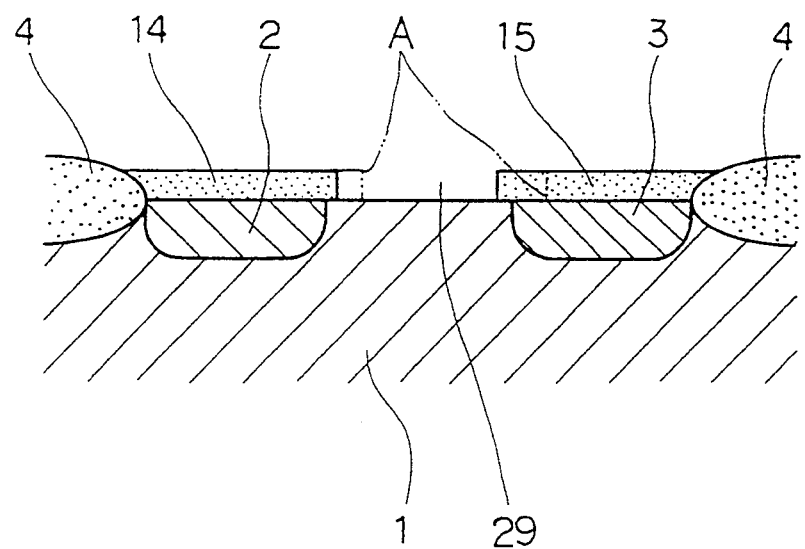

The protecting film 16 is removed, and a film of low dielectric constant is formed on the whole surface of the substrate 1 as shown in FIG. 26. Then, the film of low dielectric constant existing on the channel region 6 is removed so that the films 14 and 15 of low dielectric constant at both sides of the region 6 remain as shown in FIG. 26. Specifically, the resist film was removed with parting agent. Thereafter, gaseous SiH$_4$ and gaseous N$_2$O were introduced and gas phase reaction is performed at about 800° C. to form a silicon dioxide film of about 0.6 μm thickness.

Thereafter, an opening 29 of which width is the same as that of required channel region 6 is formed to the film of low dielectric constant with patterned resist film. It is most preferable that in the step shown in FIG. 24 the protecting film 16 is formed so that its width corresponds with that of the channel region 6, and that the position of the film 16 and the opening 29 formed in this step correspond with each other. However alignments for each formation must be separately carried out and even if trying to make them have the same width, they don't correspond so that one is formed on the source region 2 or the drain region 3 as shown by the dotted line A in FIG. 26. Thus, there arises a problem that the channel length is not correctly controlled. In view of this problem, in this example, the protecting film 16 is formed to be slightly wider in the step shown in FIG. 24, and the interval between the regions 2 and 3 are formed to be slightly wider.

In order to avoid this alignment problem, in the step shown in FIG. 24, if the protecting film 16 is composed of heat resistant material such as silicon nitride and after the formation of the film of low dielectric constant the protecting film 16 is removed, correct control of the width of the channel region 6 can be realized by self-alignment. However when the protecting film 16 is composed of silicon nitride, the surface of the semiconductor substrate is spoiled and crystal defect is brought. This defect can not be removed after formation of the source region 2 and the drain region 3. This reduces the semiconductor characteristics. For this reason in this example, with awareness of the marginal discrepancy a resist film is used as the protecting film 16, and the source region and the drain region are formed.

Figure 27:
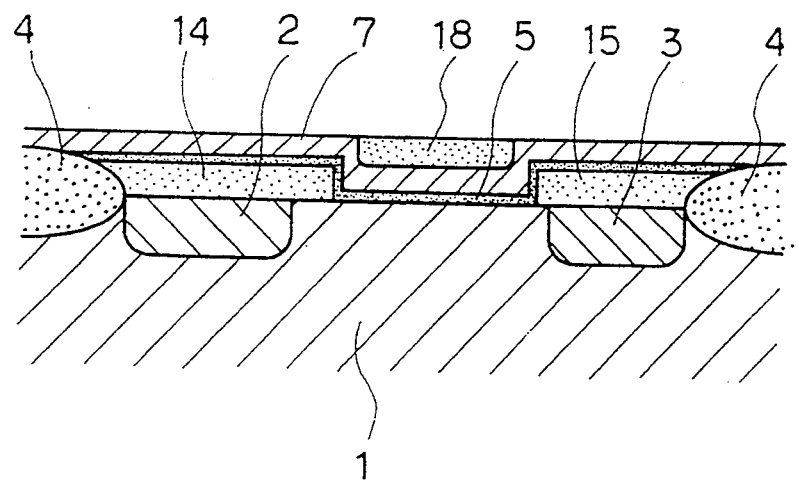

A gate insulating film 5 and a ferroelectric film 7 are formed in turn, and the surface thereof is flash as shown in FIG. 27. Specifically, a silicon dioxide film of about 0.6 μm thickness was formed by CVD method with TEOS, and a PbTiO$_3$ film of 0.5 μm thickness was formed by sputtering. Thereafter resist 18 was applied to the whole surface of the substrate 1. When there is no reaction between the ferroelectric film and the semiconductor substrate, the gate insulating film 5 is not required.

Figure 28:
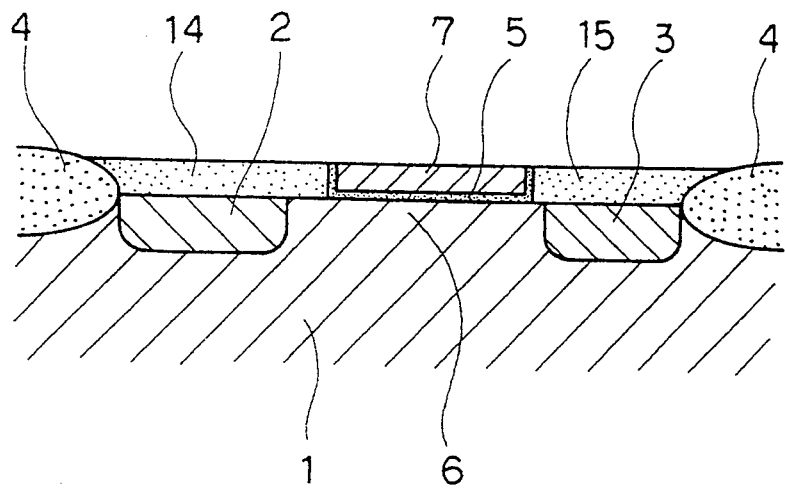

Etching back is performed so that the ferroelectric film 7 remains only a portion where the channel region 6 is to be formed as shown in FIG. 28. Specifically, dry etching with ion milling was performed till the films 14 and 15 were exposed, and then the film 7 was formed therebetween. In the ion milling, the resist and the ferroelectric film were etched by the same thickness and the surface thereof had been initially flush. For this reason, after the etching back, the films 7, 14 and 15 were all flush with one another. At this step, the semiconductor region was not damaged although the films 14 and 15 were damaged, accordingly the cell characteristics was not influenced at all.

Figure 29:
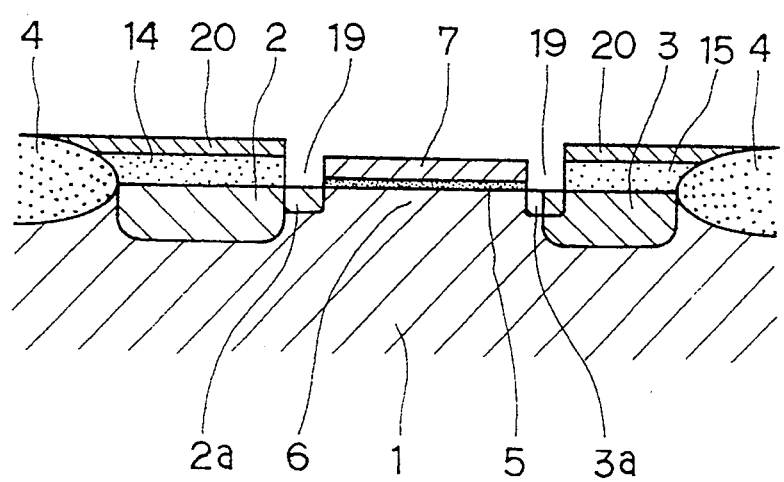

The films 14 and 15 existing around the film 7 are removed, and impurity diffusion regions 2a and 3a are formed as shown in FIG. 29. Specifically, resist was applied to the whole surface of the substrate to form a resist film 20. An opening was formed to the film 20 by patterning so that the films 14 and 15 respectively appeared with 0.5 μm width at both sides of the film 7. Thereafter etching was performed with an etchant of HF to form openings 19. Then, arsenic ion was implanted with a dose of $6 \times 10^{15}$ cm$^{-2}$ by ion implantation and heat treatment was performed at about 900° C. for about 30 minutes to form the n+-type diffusion regions 2a and 3a. The regions 2a and 3a are respectively the same conductive-type as the source region 2 and the drain region 3. Therefore, the regions 2a, 2 and the regions 3a, 3 are respectively integrated in self-alignment manner with the width of the film 7, so that the channel lengh of the region 6 can be correctly controlled.

Figure 30:
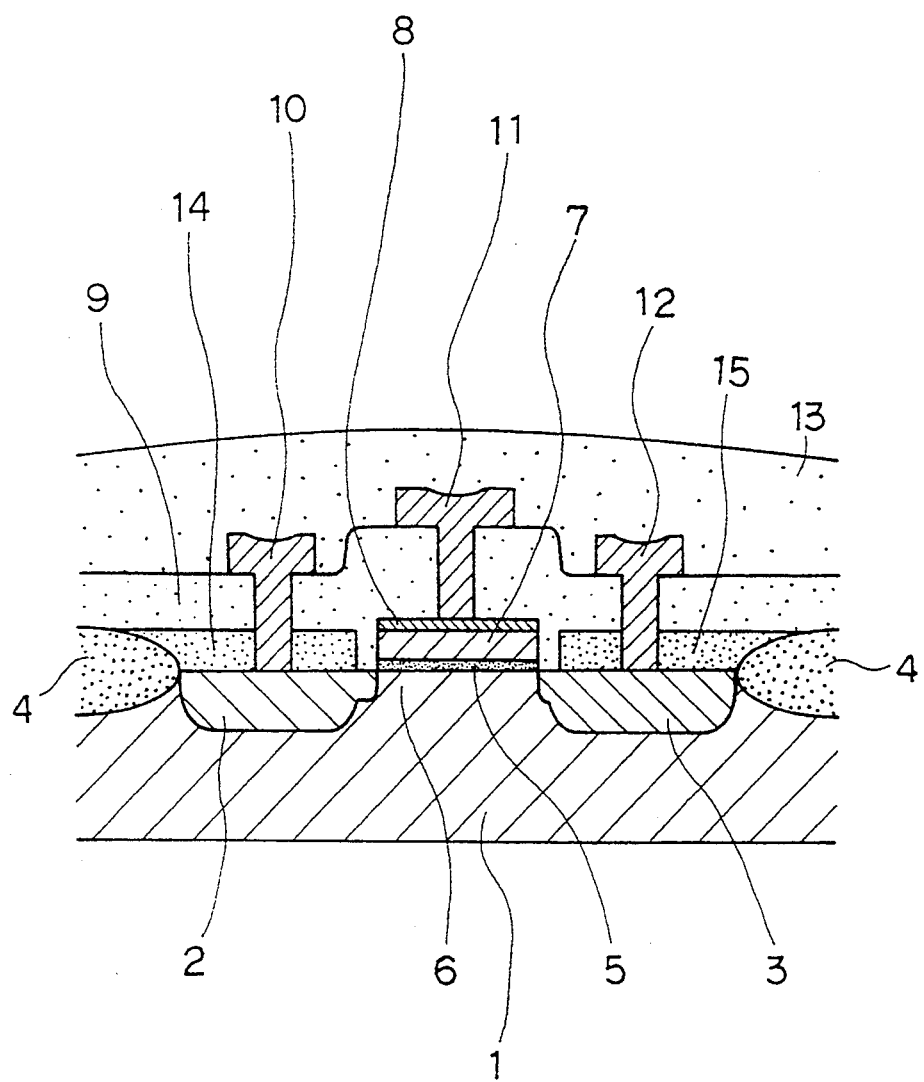

A gate electrode 8 and an insulating film 9 for insulating elements are formed to fill the openings 19, wiring of aluminium for a source electrode 10, a gate electrode 11 and a drain electrode 12 are formed, and a passivation film 13 is formed with a conventional process. Thus, the semiconductor storage cell as shown in FIG. 30 is completed.

As stated above, a film of low dielectric constant is formed on the source and the drain regions so that the ferroelectric film the semiconductor region was not spoiled on etching. That is, the film of low dielectric constant is used as a protector for the semiconductor on etching of the ferroelectric film. Further the offset of the channel region due to formation of the film of low dielectric constant is corrected. Thus, a semiconductor storage cell of excellent characteristics is realized.

As a result, the conventional problems on processing a semiconductor storage cell employing ferroelectrics is solved, and a semiconductor storage cell of excellent characteristics can be easily produced.

Though several embodiments of the present invention are described above, it is to be understood that the present invention is not limited only to the above-mentioned embodiments various changes and modifications may be made in the invention without departing from the spirit and scope thereof.

What is claimed is:

1. A method for producing a semiconductor storage device comprising:
   (a) a step for forming a protecting film by patterning on a portion of a semiconductor substrate where a channel region is to be formed;
   (b) a step for forming a source region at one side of the protecting film and a drain region at the other side of the protecting film by diffusing impurity;
   (c) a step for forming a film of low dielectric constant having a different etching characteristic from that of the protecting film on the resulting substrate;
   (d) a step for etching back the film of low dielectric constant so that the protecting film is exposed and the whole surface thereof is flushed;
   (e) a step for removing the exposed protecting film to expose the semiconductor substrate surface;
   (f) a step for forming a ferroelectric film on the exposed substrate surface directly or with a gate insulating film existing therebetween, and flushing the resultant surface;
   (g) a step for etching back the ferroelectric film so that the film of low dielectric constant is exposed and the ferroelectric film and the exposed film are flush with each other;
   (h) a step for forming an electrode on the ferroelectric film; and
   (i) a step for forming a source electrode, a drain electrode and a gate electrode.

2. A method for producing a semiconductor storage device comprising:
   (a) a step for forming a protecting film by patterning on a portion of a semiconductor substrate where a channel region is to be formed;
   (b) a step for forming a source region at one side of the protecting film and a drain region at the other side of the protecting film by diffusing impurity;
   (c) a step for forming a film of low dielectric constant having a different etching characteristic from that of the protecting film on the resulting substrate;
   (d) a step for etching back the film of low dielectric constant so that the protecting film is exposed and the whole surface thereof is flushed;
   (e) a step for removing the exposed protecting film to expose the semiconductor substrate surface;
   (f) a step for forming a ferroelectric film on the exposed substrate surface directly or with a gate insulating film existing therebetween;
   (g) a step for patterning the ferroelectric film on the film of low dielectric constant;
   (h) a step for forming an electrode on the ferroelectric film; and
   (i) a step for forming a source electrode, a drain electrode and a gate electrode.

3. A method for producing a semiconductor storage device comprising:
   (a) a step for forming a field insulater film for isolating elements on a semiconductor substrate and forming a protecting film by patterning on a portion of the semiconductor substrate of at least two cells where a channel region is to be formed;
   (b) a step for forming, in the at least two cells, a source region at one side of the protecting film and a drain region at the other side of the protecting film by diffusing impurity;
   (c) a step for forming a film of low dielectric constant having a different etching characteristic from that of the protecting film on the resulting substrate;
   (d) a step for etching back the film of low dielectric constant so that the protecting film is exposed and the whole surface thereof is flushed;
   (e) a step for removing the exposed protecting film to expose the semiconductor substrate surface;
   (f) a step for forming an integrated ferroelectric film on the exposed substrate surfaces of the at least two cells directly or with a gate insulating film existing therebetween;
   (g) a step for forming an electrode on the ferroelectric film; and
   (h) a step for forming a source electrode, a drain electrode and gate electrode.

4. A method for producing a semiconductor device comprising:
   (a) a step for forming a protecting film by patterning on a portion of a semiconductor substrate where a channel region is to be formed;
   (b) a step for forming a source region at one side of the protecting film and a drain region at the other side of the protecting film by diffusing impurity;
   (c) a step for removing the protecting film, forming a film of low dielectric constant on the resulting substrate, and forming an opening to the film of low dielectric constant at a portion corresponding to the channel region;
   (d) a step for forming a ferroelectric film on a substrate surface exposed in the opening directly or with a film gate electrode existing therebetween;
   (e) a step for etching back to leave the ferroelectric film only on the substrate intended for the channel region;
   (f) a step for forming a gate electrode on the ferroelectric film;
   (g) a step for partially removing the film of low dielectric constant existing at the vicinity of both edge of the ferroelectric film and forming impurity diffusion regions there; and
   (h) a step for forming a source electrode, a drain electrode and a gate electrode.

* * * * *